United States Patent [19]
Fukuda et al.

[11] Patent Number: 5,595,857
[45] Date of Patent: Jan. 21, 1997

[54] METHOD OF FORMING A PATTERN AND PROJECTION EXPOSURE APPARATUS

[75] Inventors: Hiroshi Fukuda, Kokubunji; Tsuneo Terasawa, Ome, both of Japan

[73] Assignee: Hitachi, Ltd., Tokyo, Japan

[21] Appl. No.: 543,254

[22] Filed: Oct. 18, 1995

Related U.S. Application Data

[60] Continuation of Ser. No. 445,949, May 22, 1995, abandoned, which is a division of Ser. No. 225,821, Apr. 11, 1994, Pat. No. 5,418,598, which is a division of Ser. No. 765,060, Sep. 24, 1991, Pat. No. 5,316,896.

[30] Foreign Application Priority Data

| Oct. 24, 1990 | [JP] | Japan | 2-284229 |
| Feb. 7, 1991 | [JP] | Japan | 3-016346 |
| May 15, 1991 | [JP] | Japan | 3-110127 |

[51] Int. Cl.$^6$ ........................ G03C 5/00
[52] U.S. Cl. ............ 430/311; 430/312; 430/322; 430/325; 250/491.1; 250/492.1
[58] Field of Search .............. 430/5, 311, 312, 430/322, 325; 250/491.1, 492.1

[56] References Cited

U.S. PATENT DOCUMENTS

| 4,370,405 | 1/1983 | O'Toole et al. . | |
| 4,902,899 | 2/1990 | Lin et al. | 430/5 |
| 5,003,567 | 3/1991 | Hawryluk et al. . | |
| 5,045,417 | 9/1991 | Okamoto | 430/5 |

FOREIGN PATENT DOCUMENTS

| 235910 | 9/1987 | European Pat. Off. . |
| 370935 | 5/1990 | European Pat. Off. . |
| 367126 | 5/1990 | European Pat. Off. . |
| 56-12615 | 2/1981 | Japan . |
| 61-41150 | 2/1986 | Japan . |
| 62-212617 | 9/1987 | Japan . |

OTHER PUBLICATIONS

IEEE Transactions on Electron Devices, vol. ED-29, pp. 1828–1836.
IEEE Electron Device Letters, EDL-8, pp. 179–180.
Progress In Optics, vol. 2, 1963, pp. 133–152.

*Primary Examiner*—S. Rosasco
*Attorney, Agent, or Firm*—Fay, Sharpe, Beall, Fagan, Minnich & McKee

[57] ABSTRACT

A novel method of pattern formation and a projection exposure apparatus are disclosed, in which the pupil of a projection lens of the projection exposure apparatus used for forming an LSI pattern or the like has mounted thereon an optical filter having a complex amplitude transmittance distribution expressed substantially as $T(r)=\cos(2\pi\beta r^2-\theta/2)$ as a function of a radial coordinate r normalized by the maximum radius of the pupil. Alternatively, Fourier transform of a layout pattern drawn on the LSI is obtained, an obtained Fourier transform data is multiplied by $\cos(2\pi\beta f^2-\theta/2)$ (where f is a spatial frequency, and $\beta$, $\theta$ appropriate real numbers), the inverse Fourier transform of the resulting product is taken to produce a pattern, and this pattern or an approximate solution thereof is used as a mask pattern thereby to produce an LSI by exposure. As a result, even when the NA is increased and the wavelength shortened to improve the resolution limit, a large depth of focus and a high image quality are obtained at the same time. It is thus possible to form a pattern of 0.2 to 0.3 μm by the use of an optical exposure system.

12 Claims, 22 Drawing Sheets

FIG. 2A
DESIGNED MASK PATTERN
$A(x)$
FIG. 2D
MODIFIED MASK PATTERN
$A'(x)$
FOURIER TRANSFORM
FOURIER INVERSE TRANSFORM
FIG. 2B
$a(f)$
FIG. 2C
$a'(f)$
$\times \cos(2\pi\beta f^2 - \theta/2)$
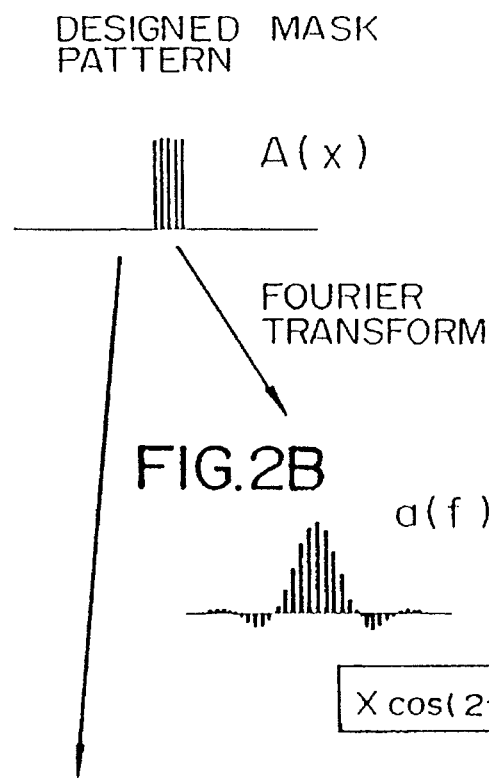
LIGHT INTENSITY DISTRIBUTION BY CONVENTIONAL MASK
LIGHT INTENSITY DISTRIBUTION BY MODIFIED MASK
FIG. 2F
PRIOR ART
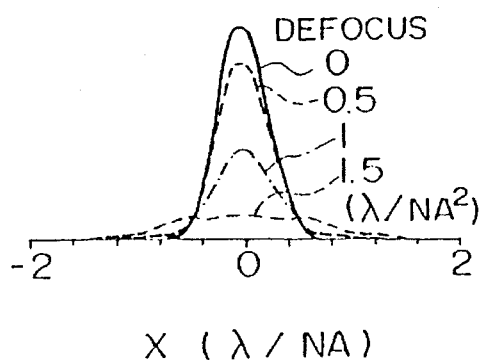
DEFOCUS 0, 0.5, 1, 1.5 $(\lambda/NA^2)$
X $(\lambda/NA)$
FIG. 2E
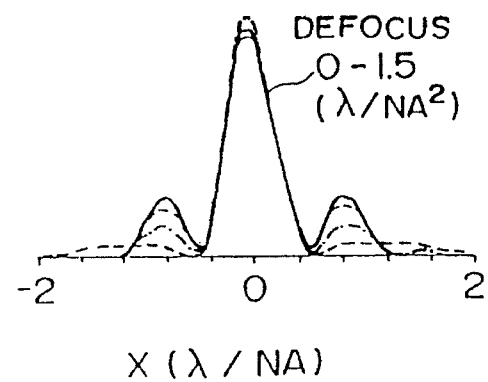
DEFOCUS 0 – 1.5 $(\lambda/NA^2)$
X $(\lambda/NA)$ MASK PATTERN
4 μm × 4 μm
LIGHT INTENSITY DISTRIBUTION
JUST FOCUS
CONVENTIONAL
FIG. 6D
LIGHT INTENSITY DISTRIBUTION
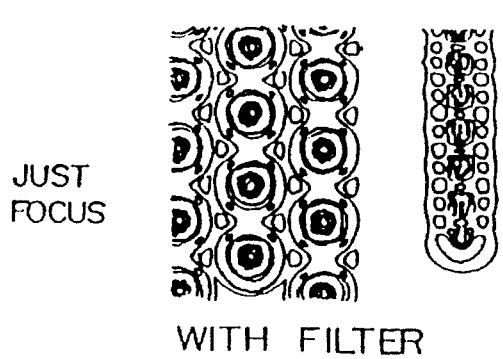
JUST FOCUS
WITH FILTER
LIGHT INTENSITY DISTRIBUTION
1 μm DEFOCUS
CONVENTIONAL
FIG. 6E
LIGHT INTENSITY DISTRIBUTION
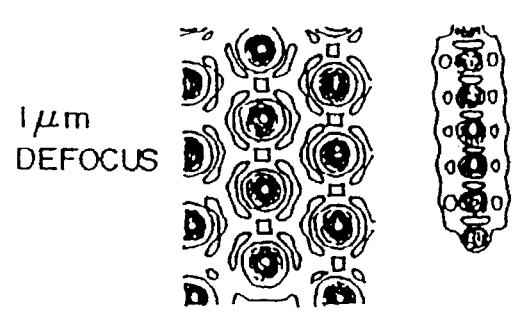
1 μm DEFOCUS
WITH FILTER

FIG. 9A

MASK PATTERN

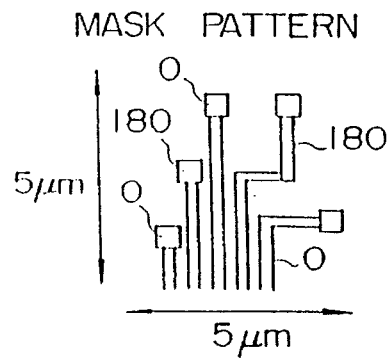

FIG. 9B PRIOR ART
LIGHT INSTENSITY DISTRIBUTION

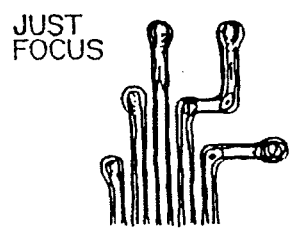

PHASE-SHIFTING METHOD
$\sigma = 0.5$

FIG. 9C PRIOR ART
LIGHT INSTENSITY DISTRIBUTION

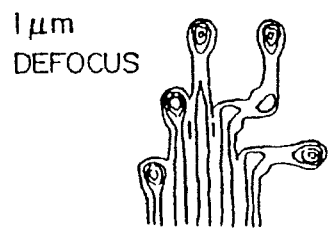

PHASE-SHIFTING METHOD
$\sigma = 0.5$

FIG. 9D PRIOR ART
LIGHT INSTENSITY DISTRIBUTION

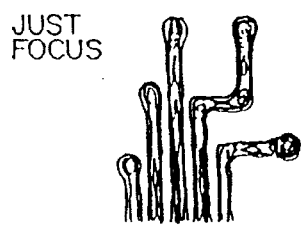

PHASE-SHIFTING METHOD
$\sigma = 0.3$

FIG. 9E PRIOR ART
LIGHT INSTENSITY DISTRIBUTION

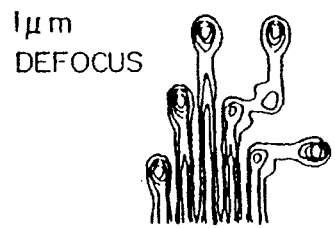

PHASE-SHIFTING METHOD
$\sigma = 0.3$

FIG. 9F
LIGHT INSTENSITY DISTRIBUTION

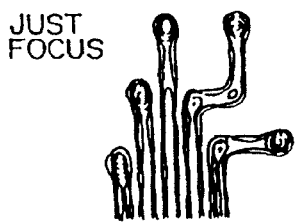

FILTER B PHASE-SHIFTING METHOD
$\sigma = 0.5$

FIG. 9G
LIGHT INSTENSITY DISTRIBUTION

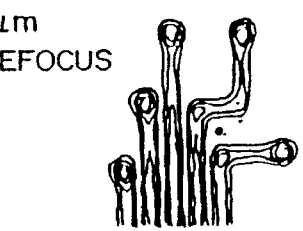

FILTER B + PHASE-SHIFTING METHOD
$\sigma = 0.5$

DEFOCUS 0 μm

DEFOCUS 1 μm

DEFOCUS 0 μm

DEFOCUS 1 μm

DEFOCUS 0 μm

DEFOCUS 1 μm

DEFOCUS 0μm

DEFOCUS 1μm

DEFOCUS 0μm

DEFOCUS 1μm

DEFOCUS 0μm

DEFOCUS 1μm

METHOD OF FORMING A PATTERN AND PROJECTION EXPOSURE APPARATUS

This is a continuation application of Ser. No. 08/445,949, filed May 22, 1995, now abandoned, which is a divisional application of U.S. Ser. No. 08/225,821, filed Apr. 11, 1994, now U.S. Pat. No. 5,418,598, issued May 23, 1995, which is a divisional application of U.S. Ser. No. 07/765,060, filed Sep. 24, 1991, now U.S. Pat. No. 5,316,896, issued May 31, 1994.

BACKGROUND OF THE INVENTION

The present invention relates to a method of forming a fine pattern for various types of solid state devices. This invention also relates to a projection exposure apparatus and a projection exposure mask used for the fine pattern formation, a method of fabricating the mask and a method of layout designing of the mask pattern. This invention further relates to an optical lens used for all optical apparatuses and an optical filter installed in the optical lens.

In order to improve the degree of integration and the operation speed of solid state devices such as LSI, circuit patterns have been miniaturized more and more. At present, a reduction projection exposure method superior in mass productivity and resolution capability is widely used for forming such circuit patterns. The resolution limit of this method is proportional to the exposure wavelength and inversely proportional to the numerical aperture (NA) of the projection lens. The depth of focus, on the other hand, is proportional to the exposure wavelength and inversely proportional to the square of NA. As a result, with the improvement in the resolution limit (increase in NA and shortening of wavelength), the depth of focus is greatly reduced.

Conventionally, there has been suggested a phase-shifting method for reversing the phase of light transmitted through an adjacent aperture on the mask as a method for remarkably improving the resolution of the projection exposure. Also, a FLEX (Focus Latitude Enhancement Exposure) method for effecting exposure by the use of images of the same mask pattern formed at a plurality of positions along the light axis has been suggested as a method for remarkably improving the depth of focus in the conventional projection exposure method. The phase-shifting method is discussed in Levenson, et al, *IEEE Trans. Electron Devices*, Vol. ED-29, pp. 1828–1836 (1982), and the FLEX method in Fukuda, et al, *IEEE Electron Device Letters* Vol. EDL-8, pp. 179–180 (1987), for example.

A method of changing the imaging characteristics by changing the distribution of amplitude or phase in a lens pupil, on the other hand, is generally known as an apodisation or an optical filtering. Further, the double diffraction method is known as a method for restoring the reduced contrast of an image. These methods are discussed in, for example, Tsujiuchi, Progress in Optics, Vol. 2, pp. 133–152 (1983), North-Holland Publishing Co.

SUMMARY OF THE INVENTION

In recent years, the circuit pattern has been more and more miniaturized with the increase in the degree of large scale integration, while electronic device structures of DRAM, a typical LSI, and the like are increasingly formed in three dimensions. As a result, the projection surface of a mask pattern on the LSI surface is undesirably affected by the ever-reducing depth of focus, thereby making it increasingly difficult to form a fine pattern on the whole surface of an LSI chip. It is therefore necessary to secure a high resolution with the required depth of focus.

If the above-mentioned phase-shifting method is applied to repetitive patterns such as an LSI wiring pattern under the illumination condition of about 0.3 in coherence factor, not only the resolution but also the depth of focus is improved greatly by a factor of two or more. In the conventional applications to hole patterns or other isolated patterns, however, both the resolution and the depth of focus are improved only by about 20%. Also, a transfer pattern identical to the mask shape cannot be obtained due to an increased proximity effect in the case of a pattern of complicated shape.

According to the above-mentioned FLEX method, on the other hand, the depth of focus of an isolated pattern like a hole pattern is improved greatly by a factor of two or three. In this method involving a plurality of exposures effected while moving the substrate stage mainly along the light axis, however, the exposure control is complicated and mechanical operation of the substrate stage is required during exposure of the chip. Another problem is that the image contrast is deteriorated in patterns having a comparatively large proportion of exposure area, or especially, repetitive patterns of LSI wirings or the like.

An object of the present invention is to provide a novel method of forming patterns, a projection exposure apparatus, a mask, a mask fabrication method and a pattern layout method which are capable of maintaining a large depth of focus in spite of a larger NA and a shorter wavelength to improve the resolution limit without posing any of the problems mentioned above.

In the references cited above, a multiple-foci filter is suggested by Dr. Tsujiuchi, et al. Such a filter, however, is intended for setting the focal point to a plurality of mutually-distant planes in a system having a large aberration, and fails to take into full consideration the phase relation between a plurality of images formed at the focal points. It is therefore not always possible to assure the desired effect in a diffraction limited optical system. Further, the spatial distribution of the transmittance (transmission) and phase of the filter for securing a uniform light intensity along the light axis in accordance with various patterns are not defined clearly.

Another object of the present invention is to provide a projection exposure apparatus using a novel optical filter, an optical lens and the above-mentioned lens which is capable of maintaining a large depth of focus and a resolution capability in a diffraction limited optical system of a projection exposure apparatus for LSI or the like.

A large depth of focus is required in various fields of optics in addition to the reduction projection exposure described above. More specifically, an optical microscope for observing objects having a three-dimensional structure such as living creatures and the surfaces of LSI, a microlens for an optical disk head, and general optical devices including cameras and telescopes are expected to find applications in wider areas and may be improved in capacity by increasing the depth of focus. As the second object, the present invention provides a novel optical lens capable of maintaining a large depth of focus also in such general optical devices, and an optical filter used for such a purpose.

According to one aspect of the present invention, when projection exposure is effected through a mask pattern on a predetermined region of a photoresist layer formed on a substrate having a topography in the surface thereof, images of the mask pattern having substantially the same amplitude are formed simultaneously at mutually-distant first and second positions having different distances from the reference level of the substrate along the light axis, and the phase correlation between the images formed at the two positions satisfies a predetermined condition, whereby the sum of exposure amounts in the region interposed between the first and second positions is equal to or more than the exposure amount capable of forming a pattern of the photoresist layer by development.

According to another aspect of the present inventions, when projection exposure of a mask is effected on a substrate through a projection lens by use of light, the distribution of the complex amplitude transmittance of the mask pattern or the pupil (or an aperture stop plane at a position conjugate therewith) of the projection lens or the illuminance distribution of an effective light source is set in such a manner that the amplitude distribution of the light transmitted through the pupil of the projection lens is equal or appropriately approximate to the amplitude distribution of the light obtained on the pupil when a mask having the desired design pattern is illuminated with a normal partially spatial coherent light or a spatial coherent light, multiplied by $\cos(2\pi\beta r^2 - \theta/2)$ (r: pupil radius coordinate, $\beta$, $\theta$: appropriate real number).

According to still another aspect of the present invention, an optical filter having the distribution of complex amplitude transmittance expressed by $$T(r) = \cos(2\pi\beta r^2 - \theta/2) \times circ(r)$$

($\beta$, $\theta$: appropriate constant), or the distribution of complex amplitude transmittance with an appropriate discrete function of T(r), is disposed substantially at a pupil plane of the lens, a plane conjugate with the pupil plane or an aperture stop position determining the numerical aperture of the lens.

According to a further aspect of the invention, the Fourier transform of the layout pattern drawn on the LSI is obtained, the pattern data obtained after Fourier transform are multiplied by $\cos(2\pi\beta f^2 - \theta/2)$ (f: spatial frequency), and the inverse Fourier transform of the resulting product is taken, so that the pattern thus obtained or a solution approximate thereto is used as a mask pattern to fabricate an LSI by exposure.

BRIEF DESCRIPTION OF THE DRAWINGS

FIGS. 2A to 2D are other diagrams typically showing the principle of the present invention and a process for producing a modified mask pattern from a designed mask pattern, FIG. 2E is a diagram showing the distribution of light intensity by a modified mask, and FIG. 2F is a diagram showing the distribution of light intensity by a conventional mask.

FIG. 6D is a diagram showing the light intensity distribution in the case where the filter according to the present invention is used with the contact hole pattern according to the present invention just focused, and FIG. 6E is a diagram showing the light intensity distribution in the case where the filter according to the present invention is used for the contact hole pattern of FIG. 6A with the contact hole pattern defocused by 1 μm.

FIG. 9A is a diagram showing an example of a wiring pattern of an LSI circuit, FIGS. 9B to 9E are diagrams showing the light intensity distribution under various conditions when the conventional method is applied to the wiring pattern shown in FIG. 9A, and FIGS. 9F and 9G are diagrams showing the light intensity distribution under various conditions when the present invention is applied to the wiring pattern shown in FIG. 9A.

DESCRIPTION OF THE PREFERRED EMBODIMENTS

Figure 1:
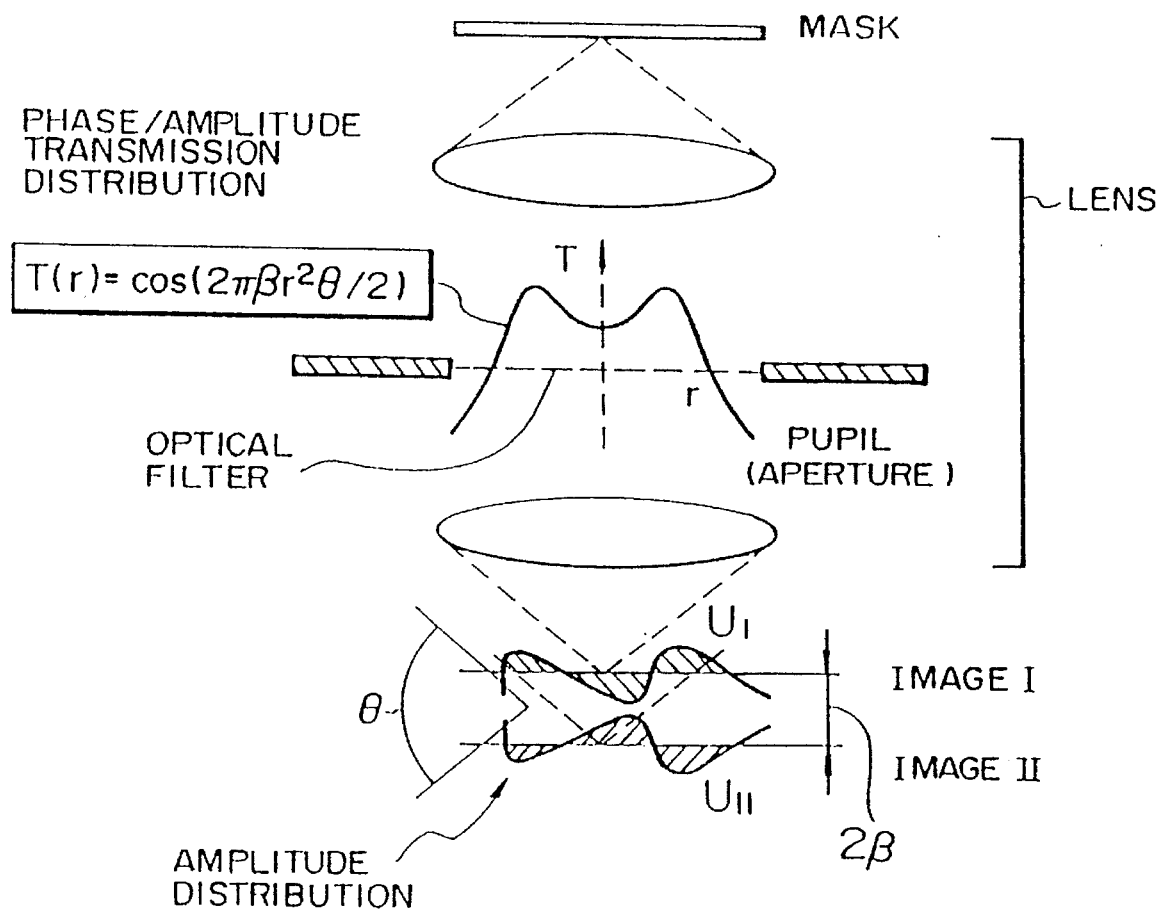
FIG. 1 is a diagram typically showing the principle of the present invention.

In order to facilitate a better understanding of the present invention, there will first be described the principle of the present invention with reference to FIGS. 1, 2A to 2F and 3A to 3D.

The amplitude distribution $U_0$ of an image projected by coherent light is written as shown below as a function of the defocus z and the position vector x within the plane perpendicular to the light axis.

$$U_0(x,z)=exp(i\phi)\int a(f) \cdot p_0(|f|z) \cdot exp(2\pi i x \cdot f)df \quad p_0(r,z)= circ(r) \cdot exp((2\pi i z r^2) \quad (1)$$

where a(f) is the Fourier spectrum of the mask pattern, $p_0(r,z)$ the pupil function, f the spatial frequency vector normalized by NA/λ, and r the radial coordinate of the pupil plane normalized by the maximum aperture radius. The amplitude transmittance distribution of the pupil plane of the projection lens is assumed to be a two-dimensional function circ(r) which becomes 1 when $0 \leq r \leq 1$ and 0 when $1 < r$. The defocus z holds the relation $D=2z\lambda/NA^2$ with the defocus amount D of real dimensions on the light axis. The term $exp(i\phi)$ represents the light please and φ is regarded as equal to $2\pi D/\lambda = 4\pi z/NA^2$.

Now, when the image plane of the original image is moved in parallel to the light axis (z) by +β with the phase thereof displaced by +Δφ, the amplitude distribution thereof is given as $U_0(x,z - β)exp(iΔφ)$. Therefore, the amplitude distribution U' (x,z) of a composite image composed of an image formed at z=+β with the phase displaced by +Δφ and an image formed at z=-β with the phase displaced by -Δφ is given as $$U'(x,z)=[U_0(x,z-\beta)exp\ (i\Delta\phi)+U_0(x,z+\beta)\ exp(-i\Delta\phi)]/2 \quad (2)$$

Substituting Equation (1) into Equation (2), $$U'(x,z)=exp(i\phi)x\int a(f) \cdot cos\ (2\pi\beta f^2-\theta/2) \cdot p_0(|f|,z) \cdot exp(2\pi i x \cdot f)df \quad (3)$$

where $\theta=2\Delta\phi-8\pi\beta/NA^2$, which is equivalent to a net phase difference as expressed by the difference between the phase difference of the two images and the phase change caused by the change in the distance between the image planes. Comparison of Equations (1) and (3) shows that the amplitudes of the two images (with a distance 2β between the image planes) formed at different positions along the light axis may be superimposed while controlling the phase difference (θ) of each image, by introducing cos $(2\pi\beta f^2-\theta/2)$ in the amplitude integration. In the case where the light source has a finite magnitude (partially coherent illumination), "a(f)" in Equation (3) may be changed to [∫ S(s). a(f-s)ds] with S(s) as an effective light source.

The term cos $(2\pi\beta f^2-\theta/2)$ may be introduced into the integral of Equation (3) by either of the two methods mentioned below.

A first method consists in changing the pupil function to $$p'(|r|,z)=\cos(2\pi\beta r^2-\theta/2)\cdot p_0(|r|,z) \quad (4)$$

The pupil function can be regarded as a complex amplitude transmittance distribution of the pupil of the projection lens (or the aperture stop at a position conjugate therewith). As a result, in order to obtain the above-mentioned pupil function p', the amplitude transmittance distribution of the pupil or the aperture stop is set to $\cos(2\pi\beta r^2-\theta/2)$. An outline of this method is shown as a model in FIG. 1. If a spatial filter expressed by a complex amplitude transmittance distribution $$T(r)=\cos(2\pi\beta r^2-\theta/2)\cdot circ(r) \quad (5)$$

is provided in the pupil or the aperture stop, it is possible to combine the amplitudes UI and UII of two images I and II formed at different positions along the light axis while controlling the phase difference between the two images. The distance between two image planes and the phase difference may be set as desired depending on the values β and θ in Equation (5).

A second method of introducing the term $\cos(2\pi\beta f^2-\theta/2)$ in the integral of Equation (3) consists in using a new mask pattern whose Fourier transform a'(f) becomes $$a'(f)=a(f)\times\cos(2\pi\beta f^2-\theta/2) \quad (6)$$

This method is briefly shown as a model in FIG. 2. The Fourier transform a(f) (See FIG. 2B) of the complex amplitude transmittance distribution A(x) of the designed mask pattern shown in FIG. 2A is determined, and the result is multiplied by $\cos(2\pi\beta f^2-\theta/2)\cdot circ(r)$ as a'(f) (FIG. 2C). Further, the complex amplitude transmittance distribution A'(x) (See FIG. 2D) of a new mask pattern is determined by the inverse Fourier transform of a'(f). More specifically, when a mask with the amplitude transmittance distribution thereof is expressed as $$A'(x)=F^{-1}[F\{A(x)\}\times\cos(2\pi\beta f^2-\theta/2)\cdot circ(|f|)] \quad (7)$$

the composite amplitude distribution of Equation (3) is obtained. Here, F[f(x)] and $F^{-1}[g(t)]$ represent the Fourier transform of f(x) and the inverse Fourier transform of g(t), respectively. The distance between image planes and the phase difference can be set as desired by the values of β and θ in Equation (7).

As shown in FIG. 2E, when a mask satisfying Equation (7) is used, it is possible to realize a satisfactory light intensity distribution with a large depth of focus as compared with the prior art (FIG. 2F). The term "circ(|f|)" in Equation (7) may be eliminated. Further, the area given as |f|>1 of the function a'(f) subjected to inverse Fourier transform may substantially take any value.

In the case of a light source having a finite capacity (partially coherent illumination), "a(f)" in Equation (1) or (3) is changed to $[\int S(s)\cdot a(f-s)ds]$ with S(s) as an effective light source. In applying the present invention under (spatially) partially coherent illumination, therefore, it is necessary to determine a mask pattern whose Fourier transform a"(f) satisfies $$\int S(s)\cdot a''(f-s)ds=\int S(s)\cdot a(f-s)\cdot\cos(2\pi\beta f^2-\theta/2)ds \quad (8)$$

The amplitude transmittance distribution A"(x) of a desired mask pattern is given below with the equation above solved as to inverse Fourier transform.

$$A''(x)=F^{-1}[F\{A(x)\cdot F^{-1}[S(f)]\}\times\cos(2\pi\beta f^2-\theta/2)\cdot circ(|f|)]/F^{-1}[S(f)] \quad (9)$$

In this equation, the convolution theorem relating to Fourier integration is used. By using a mask whose designed pattern is changed according to Equation (9), it is possible to obtain an effect under (spatially) partially coherent illumination similar to the one under spatially coherent illumination. Nevertheless, in the case of using Equation (9), there exists a singular point expressed as $F^{-1}[S(f)]=0$. In the case of almost coherent illumination, the singular point is situated far away from the main pattern and therefore the effect thereof may be ignored. With the decrease in spatial coherency, on the other hand, the singular point approaches the main pattern, with the result that the mask pattern becomes considerably complicated. Even when Equation (7) is used, a sufficient effect is obtained as long as the coherence of illumination is high to some degree. Desirable coherence conditions in such a case will be described later with reference to particular embodiments.

A similar effect is obtained in the case of a light source having a finite capacity by using an effective light source having an illumination distribution S'(s) satisfying $$\int S'(s)\cdot a(f-s)ds=\int S(s)\cdot a(f-s)\cdot\cos(2\pi\beta f^2-\theta/2)ds \quad (10)$$

as against the ordinary effective light source of partially coherent illumination.

Now, the depth of focus and the improvement in resolution by amplitude superposition described above will be explained with reference to FIG. 3.

Figure 3A:
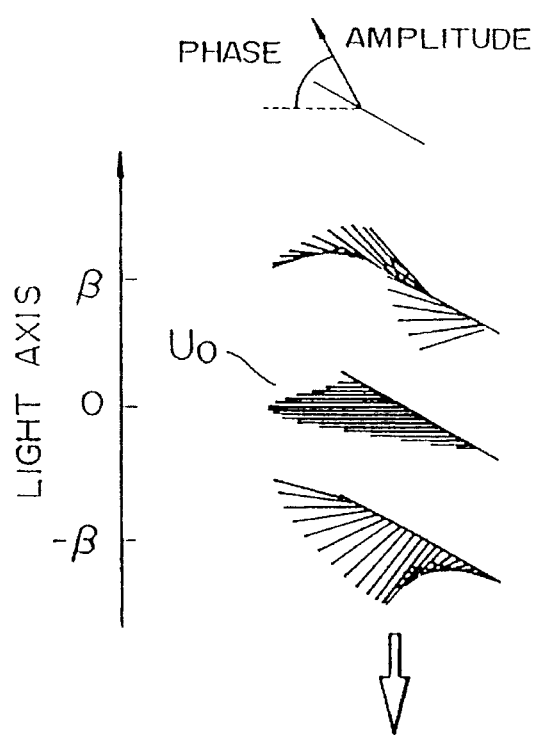
FIG. 3A is a diagram showing the phase-amplitude distributional of a projected image of a linear aperture pattern according to the prior art (conventional exposure method)
Figure 3C:
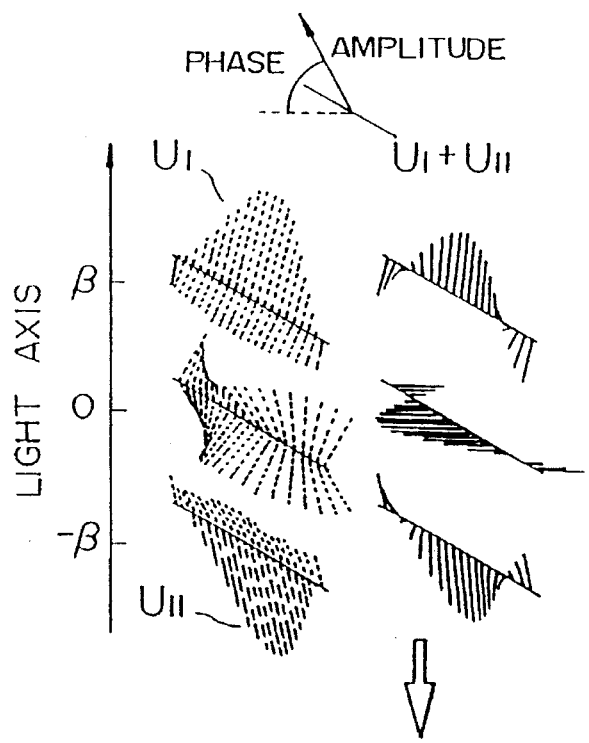
FIG. 3C is a diagram showing the phase-amplitude distribution of a projected image of a linear aperture pattern according to the present invention.
Figure 3B:
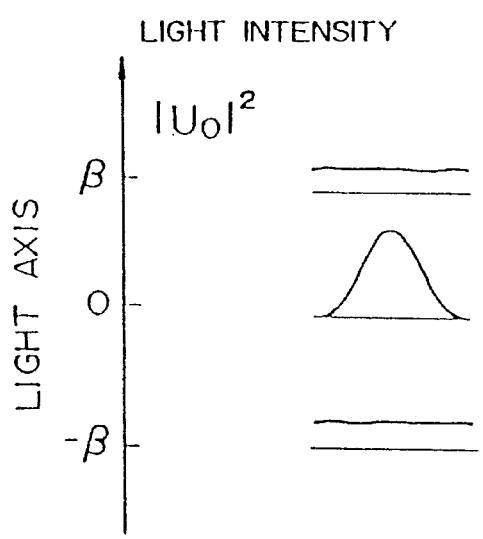
FIG. 3B is a diagram showing the light intensity distribution of a projected image of a linear aperture pattern according to the prior art.

The phase/amplitude distribution $U_0$ and the light intensity distribution which is the square of the absolute value of the phase/amplitude distribution $U_0$ of a projected image of a linear aperture pattern according to the prior art undergo a change in the manner shown in FIGS. 3A and 3B. This indicates that the image disappears by defocus.

Figure 3D:
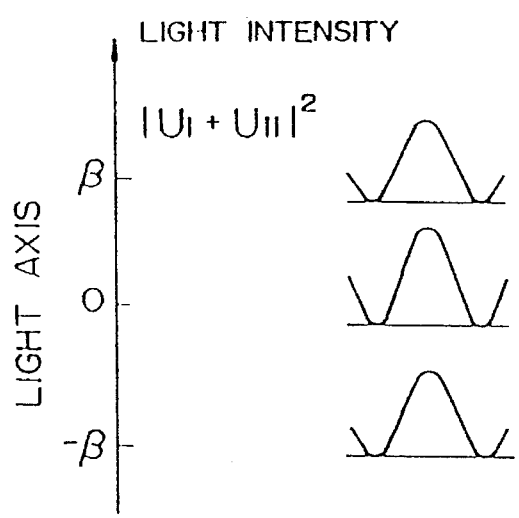
FIG. 3D is a diagram showing the light intensity distribution of a projected image of a linear aperture pattern according to the present invention.

On the other hand, FIGS. 3C and 3D show a similar result for the phase amplitudes $U_I$, $U_{II}$ and the composite amplitude $U_I+U_{II}$ of two images formed at z=±β and having phases substantially opposite to each other. The phase change of the wavelength period, however, is not included.

The fact that follows becomes known from FIGS. 3C and 3D. First, a uniform amplitude distribution having a substantially opposite phase of an image defocused by (−)2β is superposed on a mount-shaped amplitude distribution of a focused image in the vicinity of each image plane. As a result, the amplitudes offset each other near the periphery of the pattern, thereby reducing the FWHM (full width at half maximum) of the amplitude (light intensity) distribution. In the neighborhood of an intermediate point between two image planes, in contrast, the amplitudes of the images defocused by ±β are superposed one on the other. Although the absolute value of amplitude remains substantially uniform, the phase is turned by about ±45 degrees at the center of the pattern while remaining almost unchanged at the periphery thereof. The amplitudes of the two images are thus superposed with a phase difference of about 90 degrees at the pattern center, whereas the composite amplitude is zero as substantially opposite phases are offset by each other at the periphery of the pattern. The result is that an image is formed with a smaller expansion of light intensity distribution than the original image. As a consequence, the effects of the focus latitude enhancement of the FLEX method and the phase-shifting method using a peripherally-added subphase shifter are obtained at the same time, thereby improving the depth of focus and the resolution. This is almost the case with other patterns.

The values of β and θ (in radians) in the various equations shown above are preferably in the ranges set below.

$$0.3 < \beta < 0.7$$

$$10\beta - 5 < \theta < 10\beta - 2$$

Further, the desirable values of β and θ are dependent on the pattern transferred. In the case of a periodic pattern, for example, the sign of the amplitude transmittance is preferably constant except for the outermost periphery of the pupil. This does not apply to the hole pattern or the like whose Fourier transform represents a continuous spectrum. Preferable values of β and θ according to the pattern may be considered about those shown in the embodiments described below, for example.

The amplitude superposition described above is the simplest case. The number and the positions of planes of images to be superposed and the phase relation therebetween may be variously considered. In the case where three or more images are superposed by the use of a pupil filter, for instance, the cosine function in Equation (5) is changed to the sum of two or more distribution functions in the form of Equation (5) with an appropriate weight and having different values of β and θ. More specifically, a general formula of the complex amplitude transmittance for securing amplitude superposition of a plurality of images is given as $$T(r) = \sum_{i=1}^{M} C_i \cdot \cos(2\pi\beta_i r^2 - \theta_i/2) \quad (11)$$

In view of the fact that the light intensity of an image decreases extremely while the depth of focus increases with the increase in the number of image planes, however, the number of image planes is preferably two or three. In order to increase the transmittance of the optical filter, on the other hand, the value of each $C_i$ is preferably set in such a manner that the maximum value of $T(r)$ ($0 \leq r \leq 1$) is about unity.

When the mask is illuminated with a point light source, the Fourier spectrum of the mask pattern is formed on the pupil plane. As a result, the amplitude transmittance $T(r)$ of the pupil is equal to the coherent transmission function regarding r as the spatial frequency. An optical filter having a frequency smaller at the center than at the periphery functions as a high frequency-enhancing filter or a low frequency-suppressing filter for reducing the transmittance of lower spatial frequencies of an optical system. Depending on how to select β and θ, therefore, the imaging characteristics are affected.

In the case of a multi-focal filter in which the transmittance decreases with the increase in r, the high frequency transmission characteristics of the optical system are deteriorated, so that the contrast of a fine pattern is decreased. When a low frequency-suppressing filter having a proper transmittance distribution with the transmittance thereof smaller at the center than at the periphery is disposed at the position of the pupil in superposition with the multi-focal filter, it is possible to suppress the decrease in the image contrast while maintaining the FLEX effect.

A comparatively satisfactory result is obtained, for instance, when a low frequency-suppressing filter satisfying the relationship $$T(r) = a(r/r') + (1-a) \quad (12)$$

where $0.7 < a < 1.0$ and $0.5 < r' < 1.0$, is superposed on a multi-focal filter satisfying the relationship $T(r) = C \cdot \cos(2\pi \cdot 0.3 \cdot r^2)$. In this case, the value C is preferably set in such a manner that the maximum value of the product of $T(r)$ and $T'(r)$ ($0 \leq r \leq 1$) is almost unity. Instead of superposing a low frequency-suppressing filter on a multi-focal filter, it is of course possible to use a filter having a complex amplitude transmittance equal to the product of the respective amplitude transmittances.

As an alternative to disposing a low frequency-suppressing filter at the pupil position of the projection optical system in superposition with a multi-focal filter, a low-contrast image that has been formed may be reproduced by the double diffraction method through the filter mentioned above.

Apart from the suppression of the low frequency components of the Fourier transform of a pattern in combining two or more images described above mainly with reference to the pupil filtering method, the same can be said of a method of modulating the phase amplitude transmittance of a mask.

First embodiment

Figure 4A:
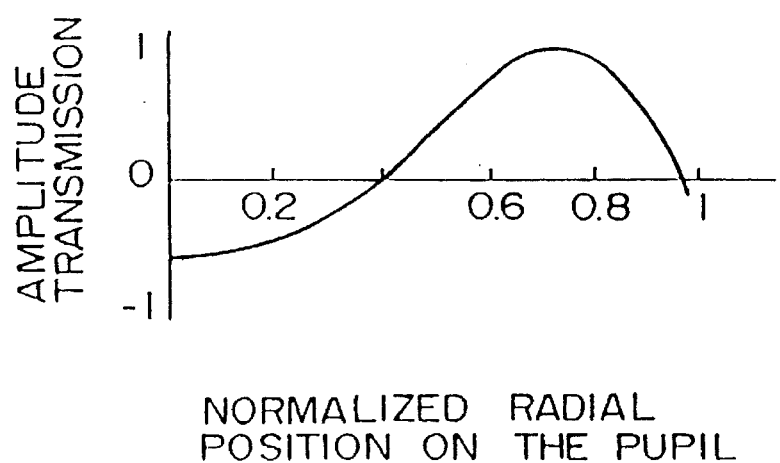
FIG. 4A is a diagram showing the complex amplitude transmittance of a filter according to the present invention.
Figure 4B:
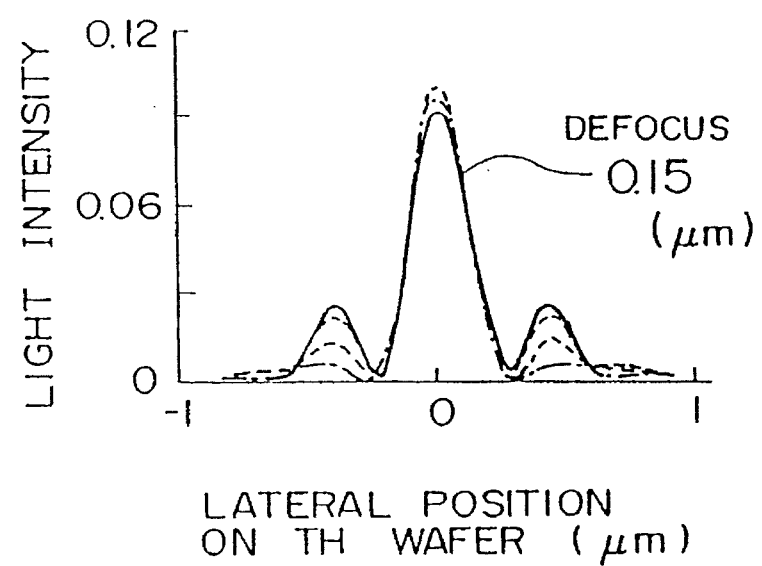
FIG. 4B is a diagram showing the focus dependence of the light intensity distribution with a filter according to the present invention applied to a hole pattern.
Figure 5A:
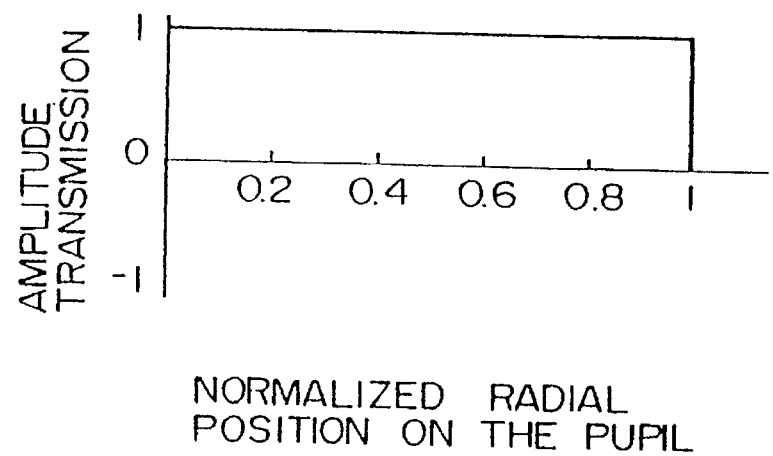
FIG. 5A is a diagram showing the complex amplitude transmittance in a pupil according to the prior art.
Figure 5B:
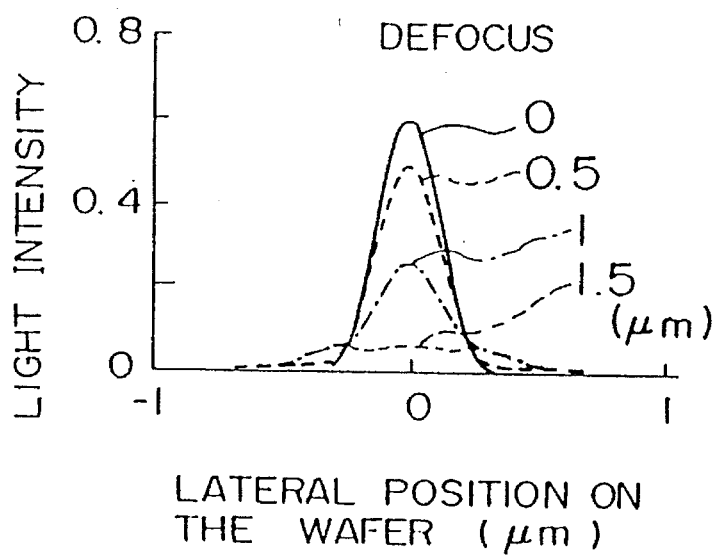
FIG. 5B is a diagram showing the focus dependence of the light intensity distribution according to the prior art.

A filter having a complex amplitude transmittance distribution (FIG. 4A) with β=0.65 and θ=260° in Equation (5) is inserted at the stop position (conjugate plane of the entrance pupil) determining the numerical aperture of a projection lens of a KrF excimer laser reduction projection exposure apparatus (coherence factor σ=0.5) having a numerical aperture of 0.5. As a result, the focus dependence of the light intensity distribution shown in FIG. 4b is obtained for a 0.3 µm hole pattern corresponding to the Rayleigh's resolution limit. A similar result obtained when lacking a filter is shown in FIGS. 5A and 5B for comparison. Comparison between FIGS. 4 and 5 shows that the insertion of the filter more than triples the depth of focus while reducing the FWHM of the light intensity distribution at the resolution limit by about 20%. The light intensity, however, decreases to one fifth of the normal level.

The above-mentioned pattern was transferred by the use of a positive-type chemically-amplified resist having a sensitivity of about 10 mJ/cm². By regulating the exposure time, a hole pattern having a diameter of 0.22 µm to 0.35 µm was formed with a satisfactory section over the focal range of ±1.5 µm. In spite of the fact that the light intensity decreased to one fifth, the exposure required only about 0.2 to 0.4 seconds.

Figure 6A:
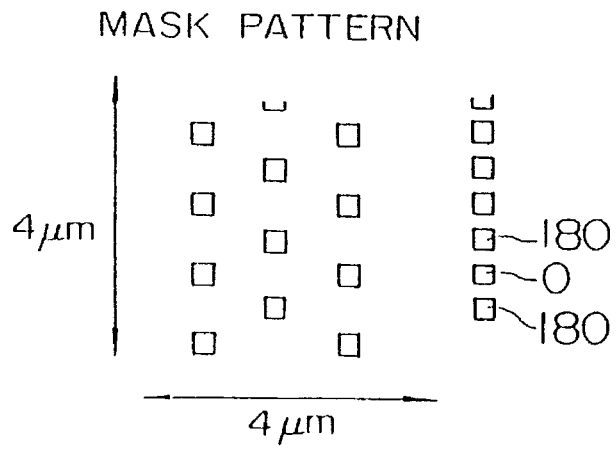
FIG. 6A is a plan view showing a contact hole pattern.
Figure 6B:
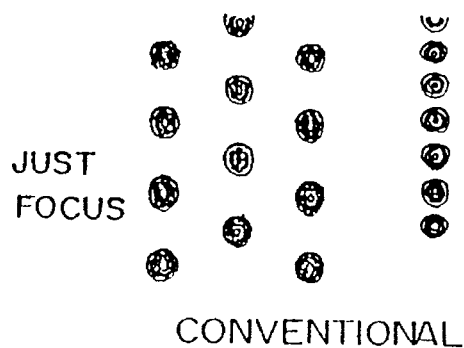
FIG. 6B is a diagram showing the light intensity distribution under a just-focused condition without using any filter according to the present invention for the contact hole pattern shown in FIG. 6A.
Figure 6C:
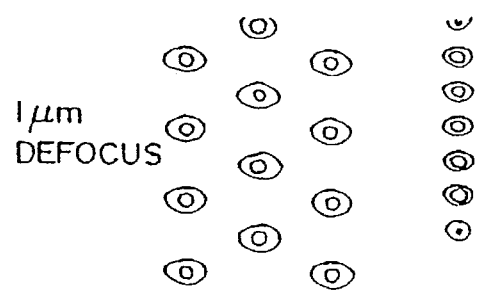
FIG. 6C is a diagram showing the light intensity distribution without using the filter according to the present invention with the contact hole pattern defocused by 1 μm.

Actual LSI contact hole patterns as shown in FIG. 6A were exposed by the use of the above-described optical system. (The numerical aperture was changed to 0.45) The resulting light intensity distributions are shown in FIGS. 6B to 6E. The insertion of a filter enables a pattern to be resolved even in the case of 1 µm defocus. When the filter is lacking, on the other hand, a 1-µm defocus causes the image to disappear almost entirely.

The wavelength of the exposure apparatus, the numerical aperture, the coherence conditions, the resist process used, the mask pattern feature size, etc. are not limited to those shown in the embodiments described herein. Also, the values of β and θ are not confined to those used above. When β=0.55 and θ=140°, for instance, the FWHM of the intensity profile is almost equal to the value obtained according to the prior art, while the FWHM of the intensity profile increases by about 30% when β=0.35 and θ=0°. In either case, the depth of focus increases as according to the present embodiment.

Second embodiment

Figure 7A:
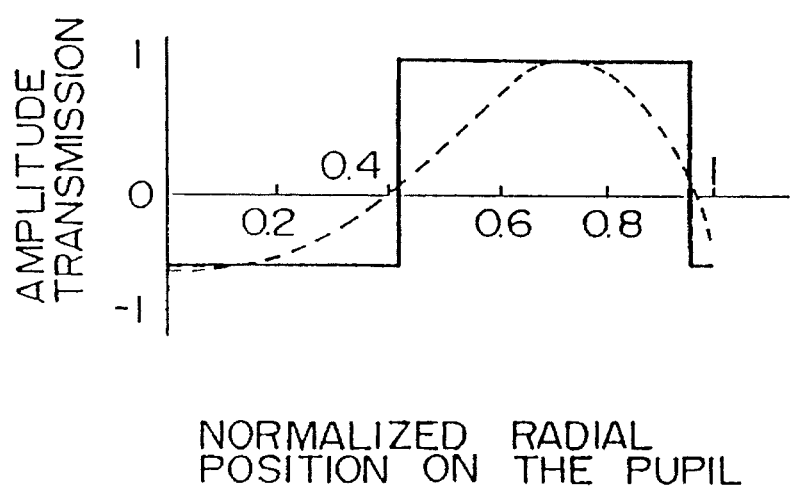
FIG. 7A is a diagram showing the complex amplitude transmittance of another filter according to the present invention.

A filter similar to that used for the first embodiment was fabricated as shown by a thick solid line in FIG. 7A. This filter was disposed at the conjugate plane of the entrance pupil of a projection lens as in the first embodiment to expose a mask pattern. The approximate complex amplitude transmittance distribution T'(r) shown by the solid line is given as $$T=1.0 \text{ (when } \cos(2\pi\beta r^2 - \theta/2) \geq 0) \text{ or } -0.6 \text{ (when } \cos(2\pi\beta r^2 - \theta/2) < 0)$$

Figure 7B:
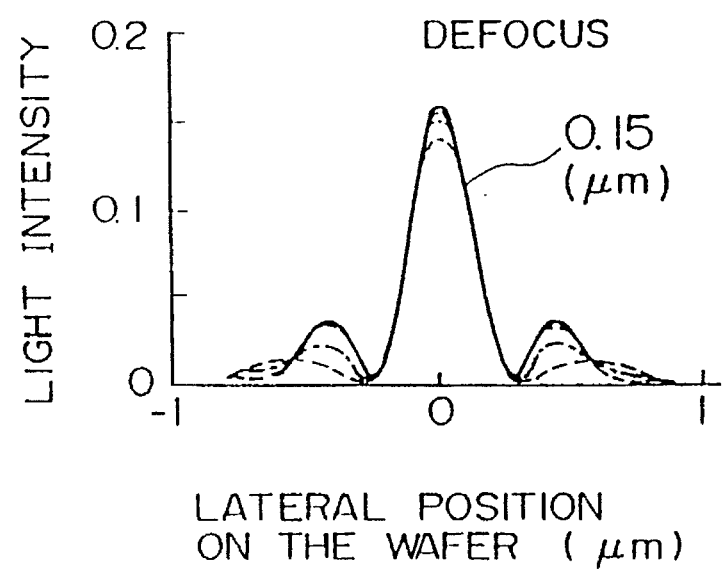
FIG. 7B is a diagram showing the focus dependence of the light intensity distribution in the case where another filter according to the present invention is applied to the hole pattern.

As a result, the focus dependence of the light intensity distribution as shown in FIG. 7B is obtained, thereby producing the same effect as in the first embodiment. In addition, the light intensity is increased by a factor of 1.5 as compared with the first embodiment, thus saving exposure time. In this way, Equation (5) may be appropriately subjected to discrete approximation.

There are various methods of approximation in addition to the one shown above.

In the case where a(f) (or $\int S(s)a(f-s)ds$ in the case of partial coherence) in the integral of Equation (3) is a function having an appropriate expansion against the spatial frequency f, there exists a function T'(f) which gives substantially the same result as when the (Fourier) integral of the product of a(f) (or $\int S(s)a(f-s)ds$) and T'(f) (and the pupil function) is substantially equal (within ±10%) to the (Fourier) integral of the product of a(f) (or $\int S(s)a(f-s)ds$) and $\cos(2\pi\beta f^2 - \theta/2)$ (and the pupil function). The complex amplitude transmittance distribution T'(r) expressed by such a function may be used as an approximate distribution of Equation (5).

Third embodiment

A filter having a complex amplitude transmittance distribution with β of approximately 0.55 and θ of approximately 140° in Equation (5) (FIG. 8A) was inserted at the stop position (conjugate plane of the entrance pupil) determining the numerical aperture of the projection lens of an excimer laser reduction projection exposure apparatus having a numerical aperture of 0.5. As the next step, line-and-space patterns (striped patterns) of various sizes were exposed and transferred at various focal positions to check the depth of focus producing a resist pattern of the desired line width having a satisfactory section, by the use of a resist similar to the one used in the first embodiment. For the purpose of comparison, a similar experiment was conducted on a case lacking a filter.

Figure 8A:
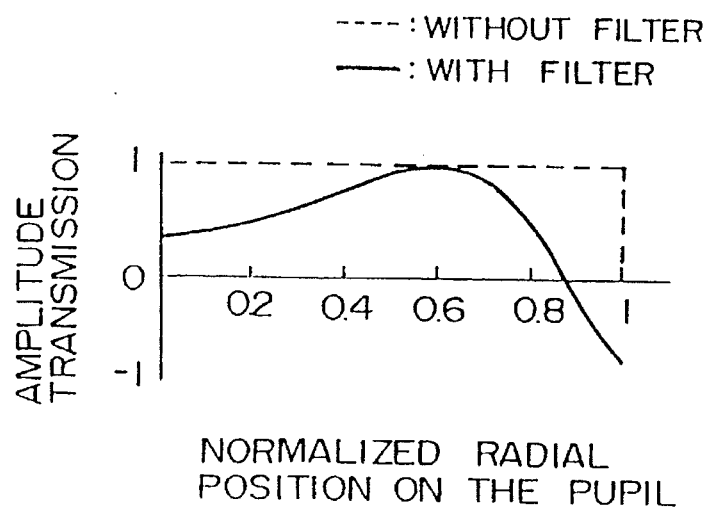
FIG. 8A is a diagram showing the complex amplitude transmittance of still another filter according to the present invention.
Figure 8B:
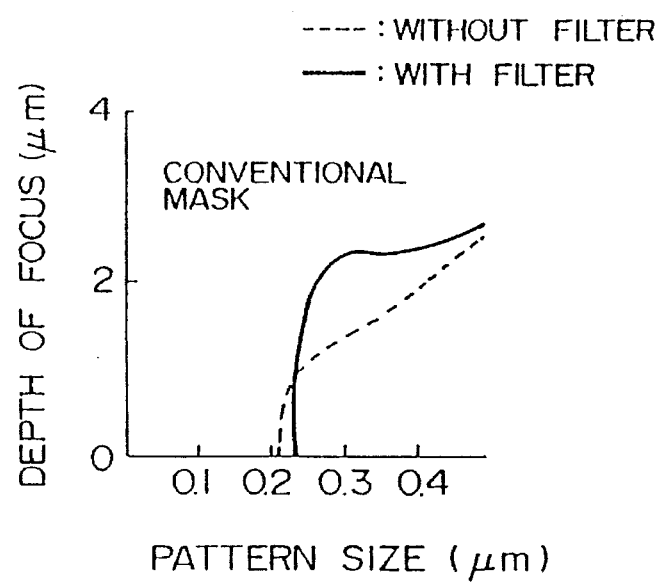
FIG. 8B is a diagram showing the relation between the depth of focus and size when no filter is used.
Figure 8C:
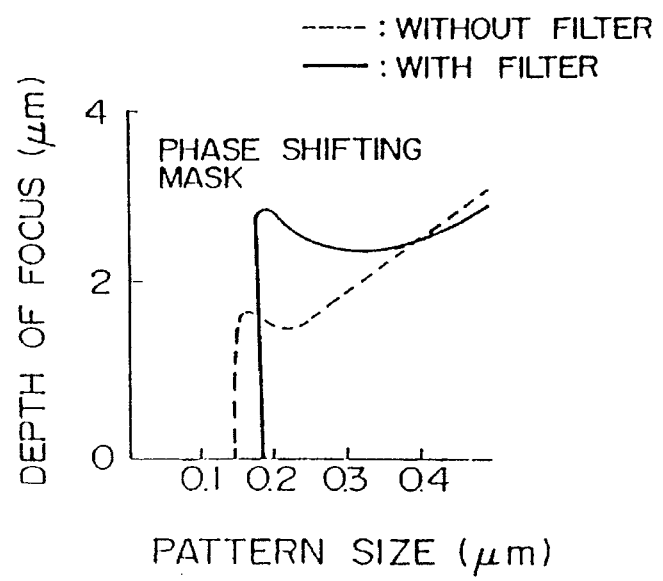
FIG. 8C is a diagram showing the relation between the depth of focus and size in the case where a filter is used.

As a result, the relationship between the depth of focus and the dimensions as shown in FIG. 8B was obtained. The result of another similar test conducted by use of a phase shifting mask of inversed phase for each aperture pattern of the line and space is shown in FIG. 8C. As seen from the drawing, the provision of a filter increases the depth of focus by about 50% to 70% for a 0.3 μm pattern corresponding to the Rayleigh's limit in the case of a conventional transmission mask, and a 0.2 μm pattern in the case of a phase shifting mask respectively. According to the present embodiment, as in the first embodiment, the absolute value of the light intensity greatly decreases, while the use of a positive-tone chemically-amplified resist of 10 mJ/cm² in sensitivity permits exposure in about 0.3 seconds.

A similar result was obtained also when the amplitude transmittance distribution of FIG. 8A was subjected to an appropriate discrete approximation as in the second embodiment.

An actual LSI wiring pattern as shown in FIG. 9A was exposed under various conditions by the use of the above-mentioned optical system (the numerical aperture was changed to 0.45). The resulting light intensity distributions are shown in FIGS. 9B to 9G (note that a phase shifting mask was used.) In the absence of a filter, the image substantially disappears in the case of 1 μm defocus at σ=0.5. Even when σ=0.3, a 1-μm defocus deteriorates the image at the peripheral parts of the wiring. The insertion of a filter makes possible a pattern resolution faithful to a mask pattern even with 1-μm defocus.

Fourth embodiment

Now, an example of design of an optical filter according to the present invention will be explained.

Two types of materials having different indexes of refraction and absorption coefficients are layered in an axially symmetric appropriate thickness distribution on an optically parallel transparent plate. The thickness of each of the materials is adjusted to attain the desired values of the phase and amplitude of the light transmitted through the layered films.

Let the indexes of refraction of the two types of material be $n_1$, $n_2$, the absorption coefficients thereof $k_1$, $k_2$ and the thicknesses thereof $d_1$, $d_2$. The phase of the light transmitted through the layered films is given as $(2\pi/\lambda_0)(n_1 d_1 + n_2 d_2)$ and the amplitude transmittance $\exp[-(2\pi/\lambda_0)(k_1 d_1 + k_2 d_2)]$. The multiple interference effect is ignored for simplification. As a result, the intended thickness distribution is obtained by solving the simultaneous primary equation with $d_1$ and $d_2$ as variables shown below against the desired amplitude transmittance distribution t(r) of a filter.

$$(2\pi/\lambda_0)[(n_1-1)d_1 + (n_2-1)d_2] = \begin{array}{l} 2n\pi \text{ (when } t(r) < 0) \\ \text{or} \\ (2n+1)\pi \text{ (when } t(r) < 0) \end{array}$$

$$\exp[-(2\pi/\lambda_0)(k_1 d_1 + k_2 d_2)] = |t(r)|$$
(n: Integer)

Figure 10A:
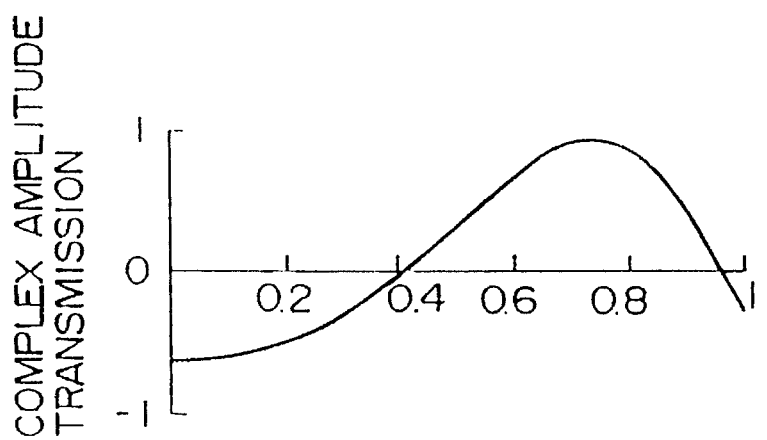
FIG. 10A is a diagram showing the complex amplitude transmittance of a filter.
Figure 10B:
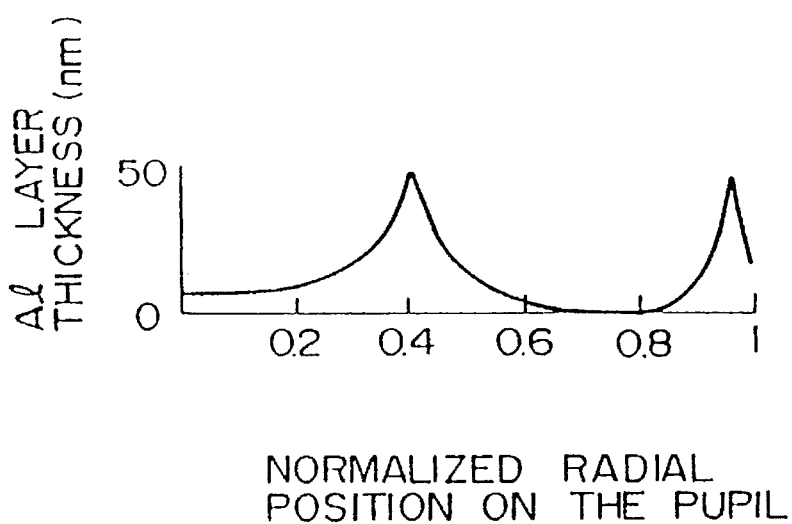
FIG. 10B is a diagram showing the Al layer thickness distribution on a filter.
Figure 10C:
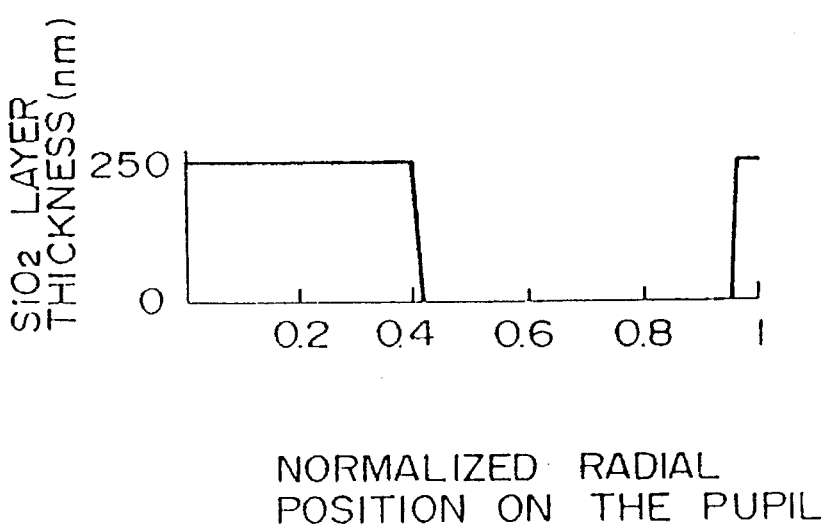
FIG. 10C is a diagram showing the SiO$_2$ layer thickness distribution on a filter.

According to the present embodiment, Al and $SiO_2$ were used as the two types of materials. The indexes of refraction of Al and $SiO_2$ for the wavelength of 250 nm are about 0.175 and 1.5, and the absorption coefficients thereof are about 2.725 and 0.0, respectively. Aluminum has a large absorption coefficient and a small index of refraction. Therefore, the required thickness and the phase change after transmission through the Al layer are small. As a result, in this combination of materials, the transmittance may be considered to be substantially determined only by the Al thickness, and the phase change only by the $SiO_2$ thickness. The complex amplitude transmittance of a filter designed for a complex transmittance distribution with β=0.65 and θ=260° in Equation (5) and the respective layer thickness distributions for Al and $SiO_2$ are shown in FIGS. 10A, 10B and 10C respectively.

The multiple interference effect which is ignored in the present embodiment for simplification should be taken into account in general cases. Also, materials other than Al and $SiO_2$ may of course be used alternatively.

Fifth embodiment

Now, an example of production of a filter having an amplitude transmittance distribution that cannot necessarily be expressed by Equation (5), and the effect thereof, will be described.

Figure 11A:
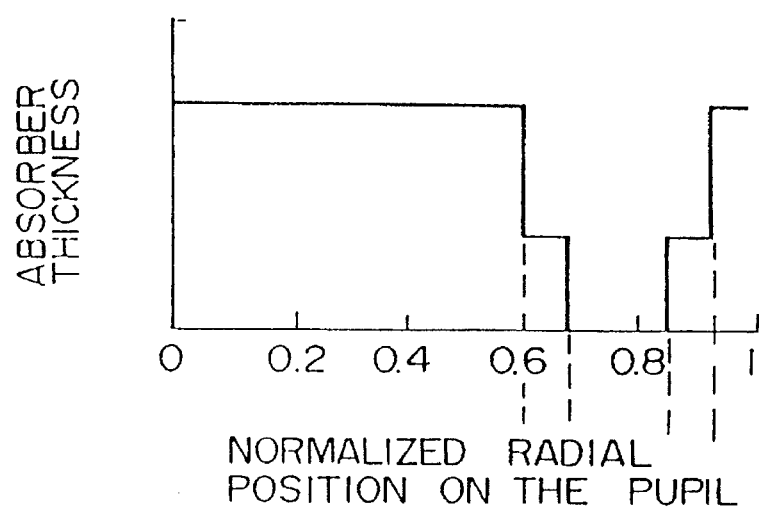
FIG. 11A is a diagram showing the radial distribution of the thickness of an absorber formed on a filter according to the present invention.

An annular Cr absorber pattern having a discrete thickness distribution was produced by depositing Cr in vacuum concentrically through various circular or annular masks having a predetermined radius on an optically parallel plate transparent to the exposure light and having a sufficient thickness accuracy against the wavelength $\lambda$ thereof. The radial distribution of absorber thickness is shown typically in FIG. 11A.

As the next step, $MgF_2$ having a thickness d of $\lambda/\{2(n-1)\}$ is deposited in vacuum through an annular mask uniformly on an optically parallel plate formed with the above-mentioned absorber pattern, thereby producing a circular phase filter pattern comprising an $MgF_2$ layer (where n Index of refraction of $MgF_2$ film). The center of the phase filter pattern is of course made to coincide with that of the annular absorber pattern.

Figure 11B:
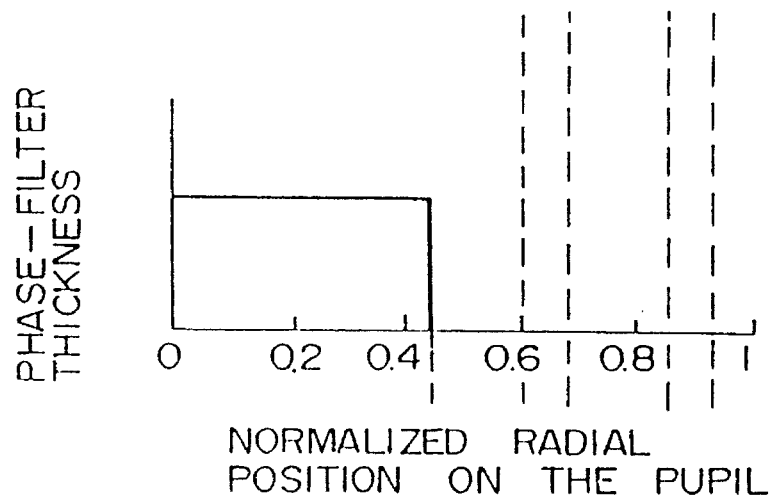
FIG. 11B is a diagram showing the radial distribution of thickness of an MgF$_2$ layer formed on a filter according to the present invention.
Figure 11C:
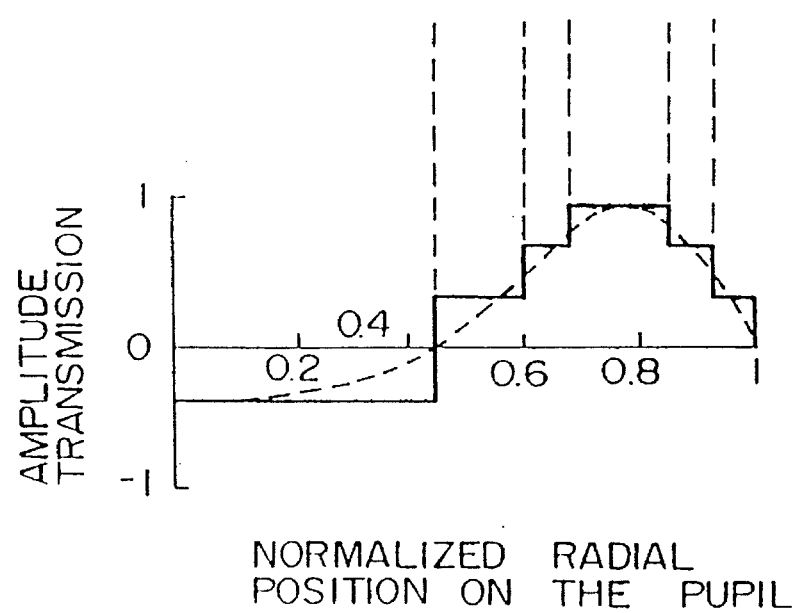
FIG. 11C is a diagram showing the complex amplitude transmittance of a filter according to the present invention.

FIG. 11B typically shows a radial distribution of an $MgF_2$ layer thickness. As a result, the radial distribution of the complex amplitude transmittance of the optical filter thus formed is as shown by a solid a line in FIG. 11C. This complex transmittance distribution is a discrete approximation of $T(r)=[1-2\cdot\cos(2\pi\cdot 0.8\cdot r^2)]/3$ (dashed line in the drawing). Applying this filter to a projection exposure apparatus as in the first embodiment, substantially the same effect as in the first embodiment was obtained.

Figure 12:
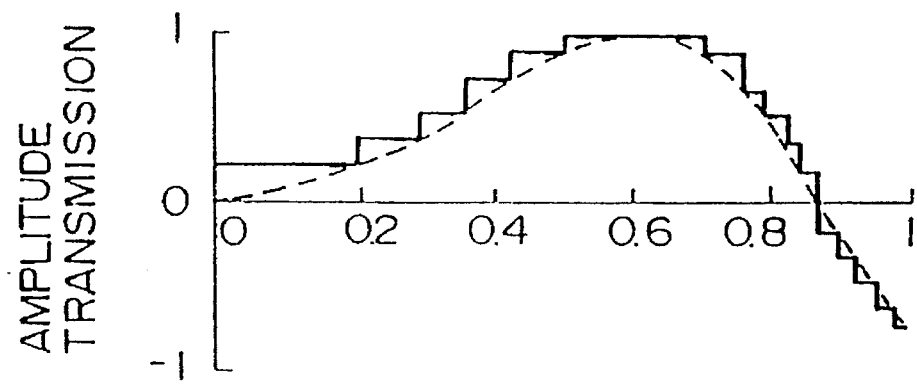
FIG. 12 is a diagram showing the complex amplitude transmittance of an optical filter according to the present invention.

Then, an optical filter having a radial distribution of complex transmittance shown by a solid line in FIG. 12 was produced in similar fashion. This complex transmittance distribution is a discrete approximation of $T(r)=\sin(2\pi\cdot 0.65\cdot r^2)$ (dashed line in the drawing). As the result of applying this filter to a projection exposure apparatus as in the first embodiment, the depth of focus for a line and space pattern having a size at the Rayleigh's limit increased by about 70%.

Figure 13:
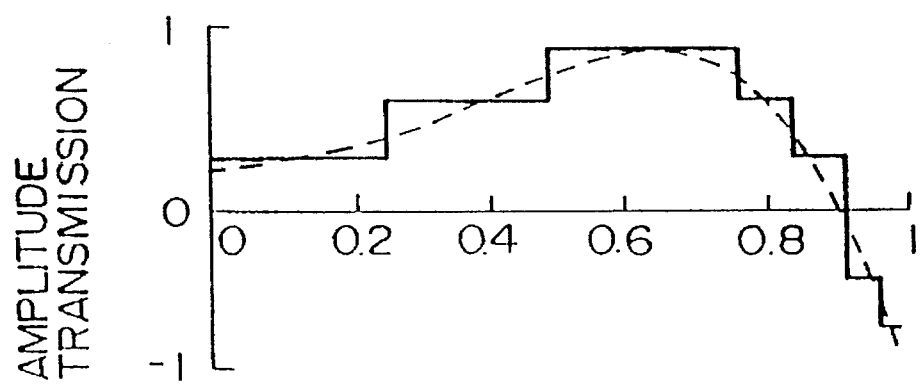
FIG. 13 is a diagram showing the complex amplitude transmittance of another optical filter according to the present invention.

Next, $T(r)=\cos(2\pi\cdot 0.3\cdot r^2)$ was multiplied by $T'(r)=0.9r^2+0.1$ and the product was subjected to discrete approximation to obtain a transmittance distribution. An optical filter having such a transmittance distribution was prepared by a method similar to the one mentioned above. The radial distribution of complex amplitude transmittance of the optical filter thus obtained is shown in FIG. 13. Applying this filter to a projection exposure apparatus in the same manner as in the first embodiment, an effect substantially similar to the one of the third embodiment was obtained. In the case of an optical filter for which $T'(r)$ is not multiplied, on the other hand, both the resolution and the cross sectional profile of the resist pattern were extremely deteriorated. The method of selection of $T(r)$ and $T'(r)$ is not limited to the one mentioned above.

Figure 14A:
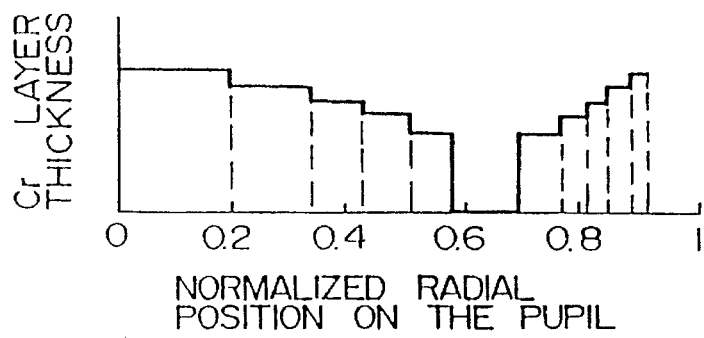
FIG. 14A is a diagram showing the radial distribution of the thickness of an annular absorber pattern formed on a filter according to the present invention.
Figure 14B:
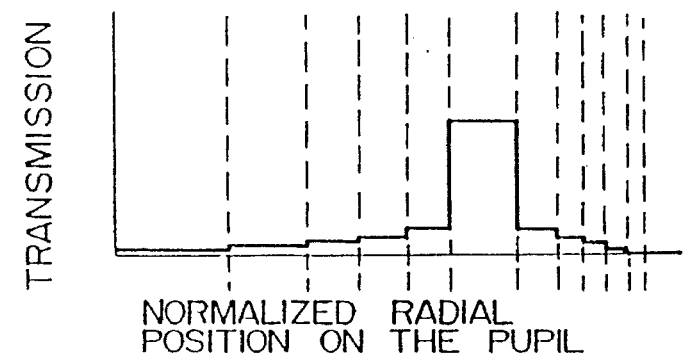
FIG. 14B is a diagram showing the light transmittance distribution of the same filter.
Figure 14C:
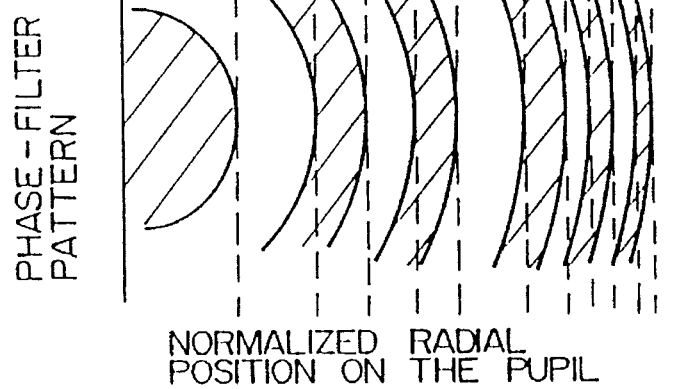
FIG. 14C is a plan view of the phase filter pattern of the filter.
Figure 14D:
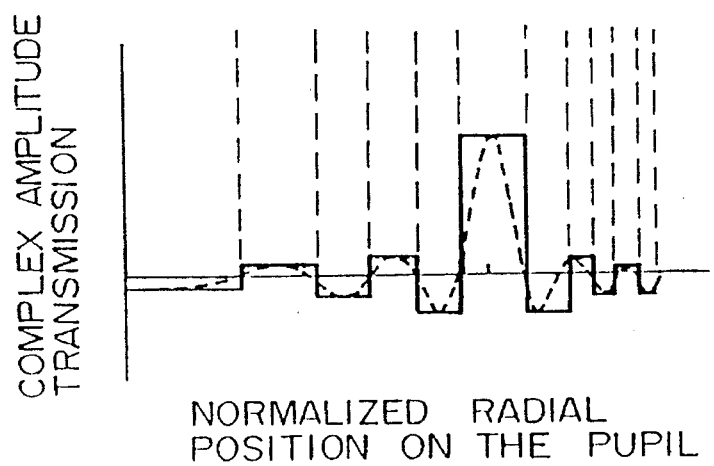
FIG. 14D is a diagram showing the complex amplitude transmittance of the filter.

As the next step, in order to obtain a depth of focus especially large against the hole pattern, an optical filter was produced by subjecting the amplitude transmittance distribution with M=5 in Equation (11) to discrete approximation. FIG. 14A shows a radial distribution of the thickness of an annular absorber pattern, FIG. 14B a corresponding transmittance distributions, FIG. 14C a plan view of a phase filter pattern, and FIG. 14D a radial distribution (solid line) of the complex amplitude transmittance of a final optical filter. (The dotted line in FIG. 14D shows a distribution based on the original equation.) This filter was applied to a reduction projection exposure apparatus as in the first embodiment, with the result that a depth of focus of more than 5 μm was obtained against a 0.3-μm hole pattern. The exposure intensity, however, was extremely decreased. Although the amplitude transmittance distribution is subjected to discrete approximation as shown in FIG. 14D according to the present embodiment, a phase filter may alternatively be produced by extracting only the phase information while reducing the discrete level or the discrete level may be set more in detail.

The absorber material Cr used according to the present embodiment may be replaced by any other material including aluminum having an appropriate absorbance of exposure light. Also, the phase filter may be made of any material other than $MgF_2$, which is transparent to exposure light and has an appropriate index of refraction. The filter may be produced by a method similar to the one described above. A pattern of an SOG (spin on glass) film may be transferred, for example, by a normal lithography process using the contact exposure method. Further, depending on the absorber material, in order to prevent the change in the thickness of the phase filter, a planarizing layer or the like may be formed on the absorber pattern.

Sixth embodiment

This embodiment is so configured that various optical filters such as those shown in the first to fifth embodiments are insertable from outside at the pupil position of the projection lens of the projection exposure apparatus. Also, when none of these special optical filters is used, an optical parallel plate having the same material and thickness as the plate of each filter is inserted to prevent the change of the optical characteristics of the projection lens.

According to the present embodiment, each filter can be set either automatically or manually by a command from the control console of the projection exposure apparatus.

Seventh embodiment

A plurality of very small filters with the light transmittance and index of refraction thereof changeable continuously by a voltage were two-dimensionally arranged to make up a filter array at the stop position for determining the pupil or aperture of the projection lens of a projection exposure apparatus. By controlling the voltage applied to each of the small filters making up the filter array independently, it is possible to set as desired the complex amplitude transmittance distribution of the stop plane determining the pupil or aperture of the projection lens. Normally, the voltage is set automatically by programming a desired complex amplitude transmittance distribution beforehand in the control computer of the projection exposure apparatus.

This function was used to obtain a complex amplitude transmittance distribution with $\beta=0.65$ and $\theta=140°$ in Equation (5). As a result, the same effect as in the first embodiment was secured. On the other hand, different voltages were applied to different small filters to obtain a complex amplitude transmittance distribution with $\beta=0.55$ and $\theta=140°$ in Equation (5), thus securing the same effect as in the second embodiment.

Eighth embodiment

Now, explanation will be made about the effect resulting from the modulation of the phase amplitude transmittance of a mask.

Figure 15A:
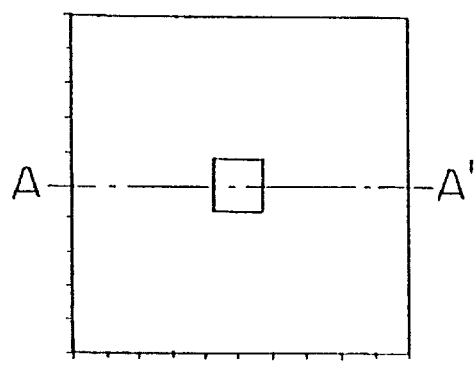
FIG. 15A is a diagram showing an aperture pattern.
Figure 15C:
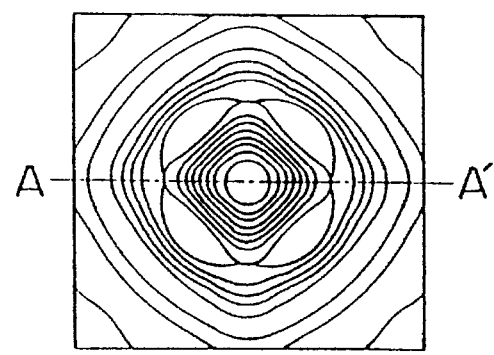
FIG. 15C is a contour map showing the amplitude transmittance distribution of a mask obtained on the basis of the aperture shown in FIG. 15A.
Figure 15B:
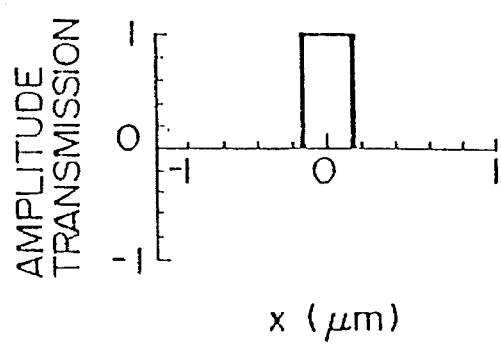
FIG. 15B is a diagram showing the amplitude transmittance along line A—A' in FIG. 15A.
Figure 15D:
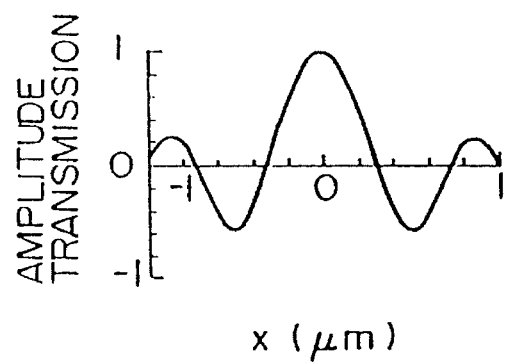
FIG. 15D is a diagram showing the amplitude transmittance along line A—A' in FIG. 15C.

First, the amplitude transmittance for a square aperture pattern having 0.3-μm sides as shown in FIGS. 15A and 15B was converted according to Equation (7). The amplitude transmittance distribution of the mask thus obtained is shown in FIGS. 15C and 15D as a contour map and a distribution along the line A—A' therein. In these diagrams, however, β was set to 0.7 and θ to 250°.

Masks having the amplitude transmittances of FIGS. 15A, 15B and 15C, 15D were prepared. A method of preparing the mask shown by FIGS. 15C, 15D will be described briefly. A plurality of combinations of an Al film capable of absorbing the exposure light and an etching stopper layer for the Al film transparent to the exposure light were formed on a Si substrate. After that, each of the layers was repeatedly subjected to the resist patterning process using the electron beam plotting and the etching of the Al film with the resist as a mask. As a result, the Al film thickness distribution was changed, so that the amplitude transmittance approximately assumed the absolute value of the amplitude transmittance shown in FIGS. 15C and 15D. Then, according to the ordinary phase-shifting method of mask preparation, a phase shifter pattern made of a $SiO_2$ film was formed in a region where the amplitude transmittance is negative in FIGS. 15C and 15D. More strictly, it is desirable to determine the $SiO_2$ thickness distribution by taking into consideration the phase change due to the Al film transmission. Since the phase change is very small, however, the $SiO_2$ thickness distribution was considered as uniform in the present embodiment.

Figure 16A:
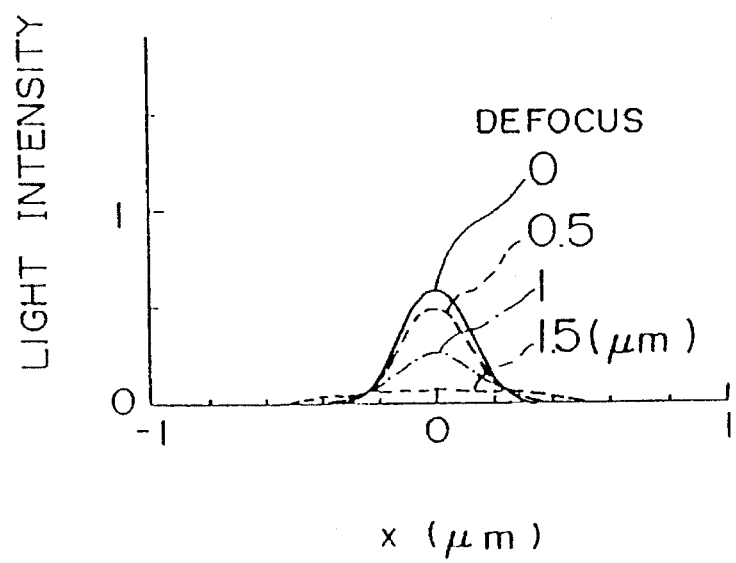
FIG. 16A is a diagram showing the focus dependence of the light intensity distribution according to the prior art.
Figure 16B:
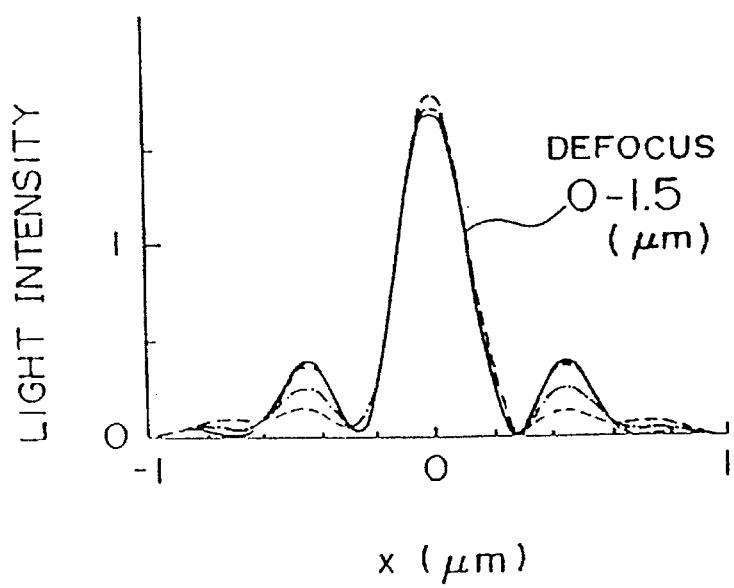
FIG. 16B is a diagram showing the dependence of the light intensity distribution on the focal point according to the present invention.

As the next step, the mask was exposed by projection on a substrate spin-coated with a positive-type chemically-amplified resist of about 50 mH/cm² in sensitivity by use of a KrF excimer reduction projection exposure apparatus having a numerical aperture of 0.5. In the process, a high coherent illumination of 0.1 in coherence factor σ was employed. As a result, the focus dependence of light intensity distribution of an optical image as shown in FIGS. 16A and 16B was obtained for the patterns shown in FIGS. 15A and 15C respectively. By using the mask shown in FIG. 15C, the depth of focus was more than tripled as compared with the conventional mask. Also, the FWHM of the light intensity distribution was reduced by about 20%, thereby improving the resolution limit. (The size of the original hole pattern is at the resolution limit, and therefore the FWHM of the light intensity distribution is not reduced by a further increase of the mask size.) Further, the absolute light intensity more than doubled.

Exposure and development was effected for various exposure doses and under various focus conditions. As a result, hole patterns of 0.2 μm to 0.35 μm in diameter having a satisfactory cross-sectional profile were formed over a ±1.5 μm focal range by adjusting the exposure time. The exposure process required less than 0.3 seconds.

Figure 17A:
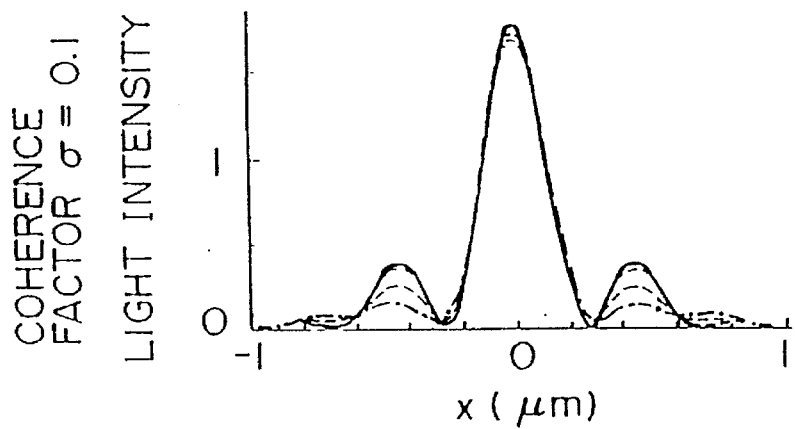
FIGS. 17A to 17D are diagrams showing the light intensity distribution for various coherence factors using a mask according to the present invention.
Figure 17B:
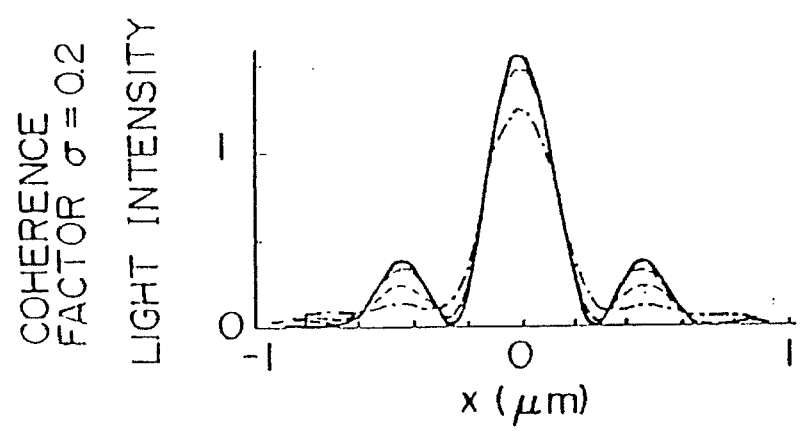
Figure 17C:
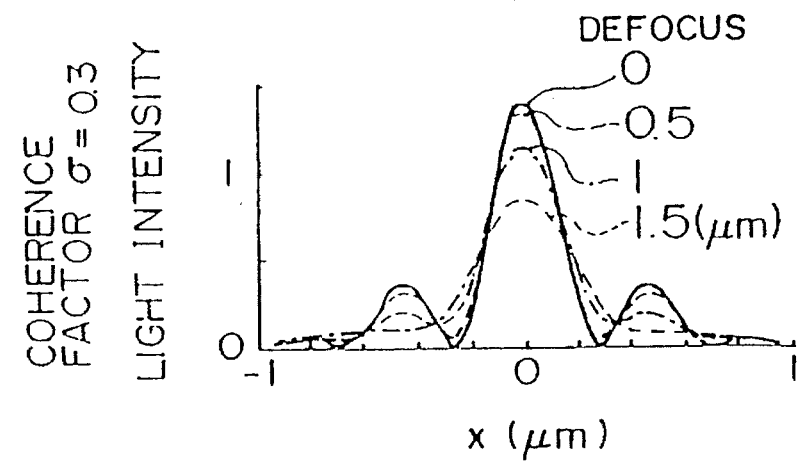
Figure 17D:
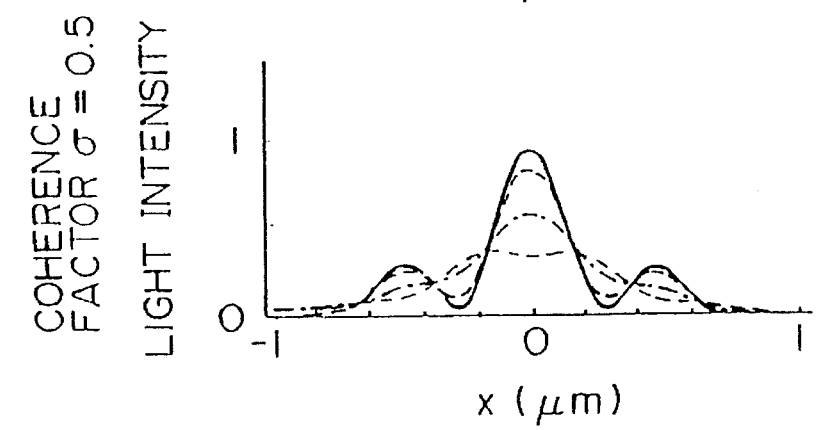

As described above, a substantial coherency (small coherence factor σ) is one of the desirable illumination conditions of the present invention. Exposure was therefore effected by changing the coherence factor σ. The coherency dependence of the light intensity distribution using the mask shown in FIGS. 15C and 15O is shown in FIGS. 17A to 17O. When σ is 0.2, an image under 1.5-μm defocus expands slightly, and when σ becomes 0.3, the image is apparently deteriorated. Comparison of the optical image at σ=0.5 with the original optical image shows that the improvement in depth of focus has decreased to about 20%. As a result, the coherence factor σ is preferably less than 0.3, or more preferably less than 0.2 or 0.1.

The wavelength, the numerical aperture, the resist process used, the coherency and the shape and size of the mask pattern of the exposure apparatus are not limited to those used in the present embodiment. Nor are the values of β and θ limited to those shown above, and optimum ones should be used according to the shape and size of the pattern involved. Further, in place of the formula $\cos(2\pi\beta f^2 - \theta/2)$ in equation (7), the function T'(f) satisfying the conditions described in the second embodiment may be used as a conversion formula thereby to produce substantially the same result even after pattern conversion. Depending on the coherency, Equation (9) may be used for conversion.

Further, any method of forming a mask other than the one described in the present embodiment may be used to the extent that a predetermined amplitude transmittance is realizable. In order to change the transmittance, for example, an appropriate material having an absorption characteristic against the exposure light may be selectively injected by use of a focused ion beam apparatus or the like. Various well-known methods may be employed also when changing the thickness distribution of an absorber.

Ninth embodiment

Figure 18A:
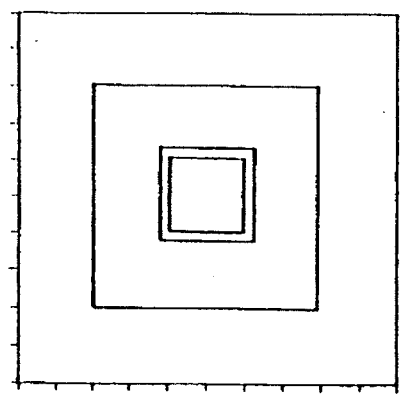
FIG. 18A is a plan view of a mask according to the present invention.
Figure 18B:
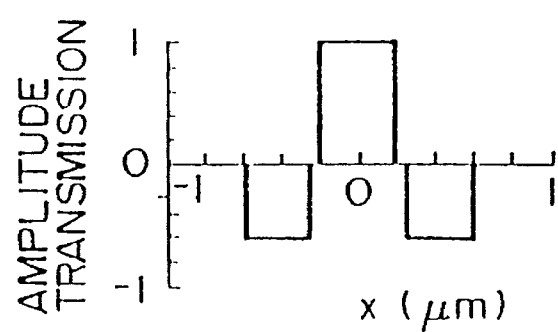
FIG. 18B is a diagram showing the amplitude transmittance of the mask shown in FIG. 18A.

A mask was prepared with the amplitude transmittance shown in FIGS. 15C and 15D subjected to discrete approximation as shown in FIGS. 18A and 18B. A composite layer of $SiO_2$ and $Si_3N_4$ films formed by the CVD method on a peripherally-added sub-aperture pattern was selectively prepared. The thicknesses of the films were determined in such a manner that the amplitude transmittance was 60% and the phase of the light transmitted therethrough was an inversion of the phase of the light transmitted through the main aperture pattern.

Figure 18C:
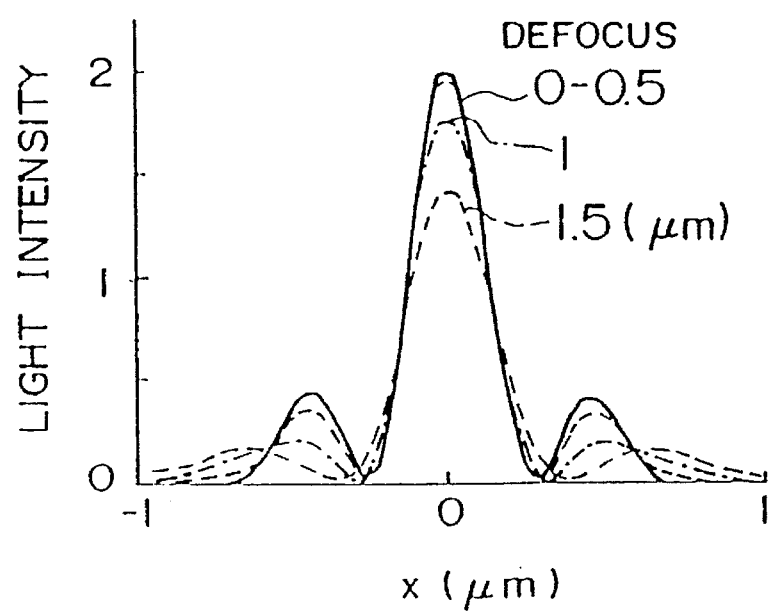
FIG. 18C is a diagram showing the focus dependence of the light intensity distribution when the mask shown in FIG. 18A is used.

The focus dependence of the light intensity distribution of an optical image obtained when using the mask of FIG. 18A is shown in FIG. 18C. In this way, substantially the same effect as in the eighth embodiment is obtained according to the present embodiment. The method of approximation is not limited to the one shown in FIG. 18A, but various other methods are available with equal effect. The corners of the sub-aperture pattern around the main pattern, for instance, may be removed. A substantially equal effect is obtained also by maintaining the center distance between the main and sub-aperture patterns almost constant while changing the width and transmittance of each pattern under the conditions where the ratio of the product of width (or area) and transmittance between the two patterns remains substantially constant.

The process for mask preparation was remarkably simplified by the present embodiment.

Tenth embodiment

Now, an example of application of the present invention to hole pattern formation in a DRAM (Dynamic Random Access Memory) will be described below.

Figure 19A:
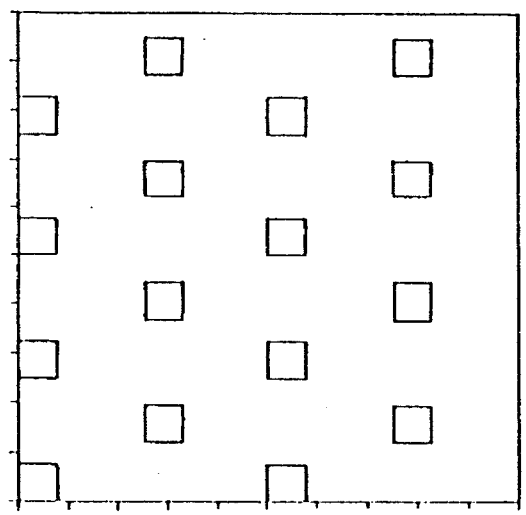
FIG. 19A is a plan view showing an example of the mask for the contact hole.
Figure 19B:
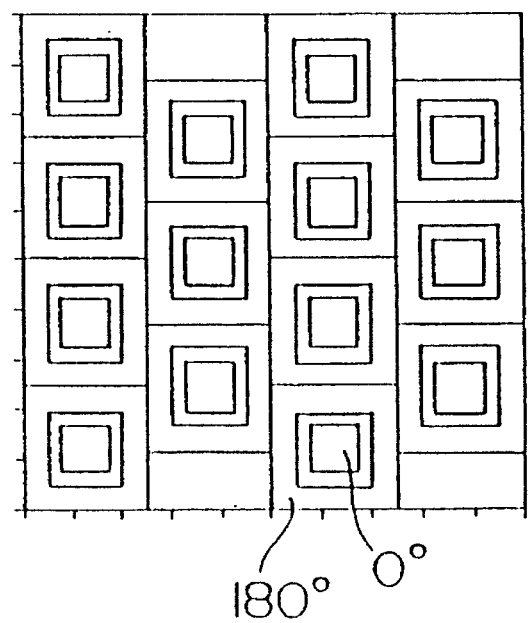
FIG. 19B is a plan view of the mask for the contact hole according to the present invention.
Figure 20A:
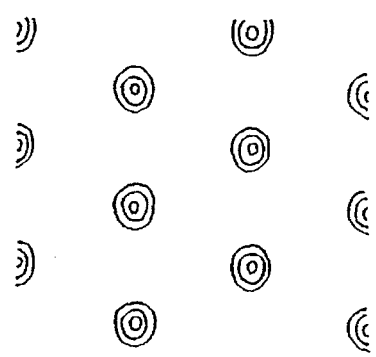
FIG. 20A is a diagram showing the light intensity distribution for 0 μm defocus when the mask shown in FIG. 19A is used.
Figure 20B:
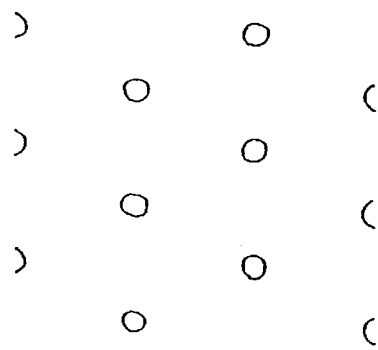
FIG. 20B is a diagram showing the light intensity distribution for 1 μm defocus when the mask shown in FIG. 19A is used.
Figure 20C:
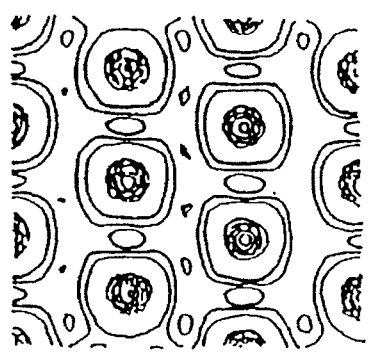
FIG. 20C is a diagram showing the light intensity distribution for 0 μm defocus when the mask shown in FIG. 19B is used.
Figure 20D:
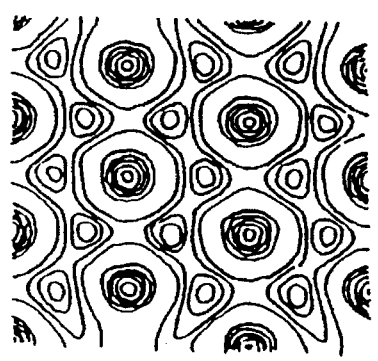
FIG. 20D is a diagram showing the light intensity distribution for 1 μm defocus when the mask shown in FIG. 19B is used.
Figure 20E:
FIG. 20E is a diagram showing the light intensity distribution for 0 μm defocus when the mask is used with the interference between patterns suppressed.
Figure 20F:
FIG. 20F is a diagram showing the light intensity pattern for 1 μm defocus when the same mask is used with the interference between patterns suppressed.

An arrangement of contact holes in a folded bit line cell is shown in FIG. 19A. The layout rule provides a wiring pitch of 0.5 m. Patterns appropriately approximating the transmittance distribution shown in FIG. 15B are simply arranged at hole pattern positions of the design mask shown in FIG. 19A to form the mask shown in FIG. 19B. The transmittance was set to 100% for both 0° and 180° regions. The masks shown in FIGS. 19A and 19B were exposed by an optical system similar to the one used in the first embodiment, and the resulting light intensity distributions are shown in FIGS. 20A, 20B and 20C, 20D, respectively. When this modified mask is used, a pattern could be resolved even under a 1-μm defocus, which causes substantial disappearance of the image according to the conventional masks. Since the proximity effect caused a considerable peak of light intensity between patterns, however, the exposure latitude was very narrow. Taking the cell symmetry into account, therefore, the phase difference of 120 degrees was introduced between adjacent patterns thereby to suppress the interference. Such a mask was prepared by forming topographical patterns (of which the size and accuracy may be relatively rough) corresponding to the phase differences of 120 and 240 degrees in advance on a reticle plate, and arranging a phase shifter similar to the one for the mask shown in FIG. 19B on the assembly. Light intensity distributions as shown in FIGS. 20E and 20F were thus obtained. The light intensity peak between hole patterns such as seen in FIGS. 20C and 20D was relatively suppressed to produce a focus region having a uniform light intensity distribution with a narrow FWHM.

Figure 21A:
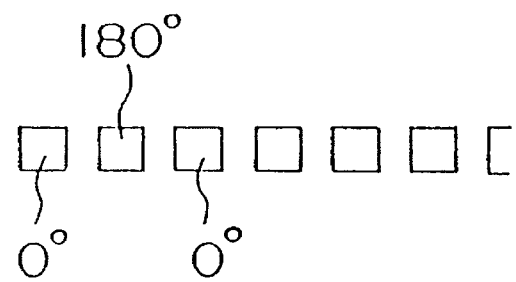
FIG. 21A is a partial plan view of a conventional mask for the hole pattern.

Now, a similar result is shown in FIGS. 21A to 21C and FIGS. 22A to 22F, for holes arranged in pitches for the period of wiring patterns (through holes between substrate and cell plate, for instance). In this case, adjacent patterns are undesirably connected by the proximity effect even at the focal point in the case of the conventional transmission mask. In view of this, a mask was prepared (FIG. 21A) introducing the phase difference of 180 degrees between adjacent patterns. Also, since a sub-shifter pattern occupies a large area as shown in FIGS. 15C, 15D and FIG. 18, sub-shifter patterns are undesirably superposed one on the other in the case where the distance between hole patterns is small. The patterns shown in FIG. 21A are converted collectively according to Equation (7) to produce the mask shown in FIG. 21B. Further, the mask shown in FIG. 21C was obtained by discrete approximation.

Figure 21B:
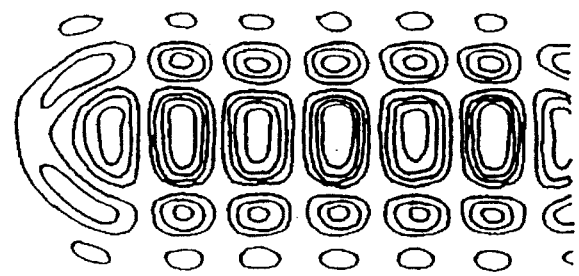
FIG. 21B is a partial plan view of a mask for the hole pattern according to the present invention.
Figure 21C:
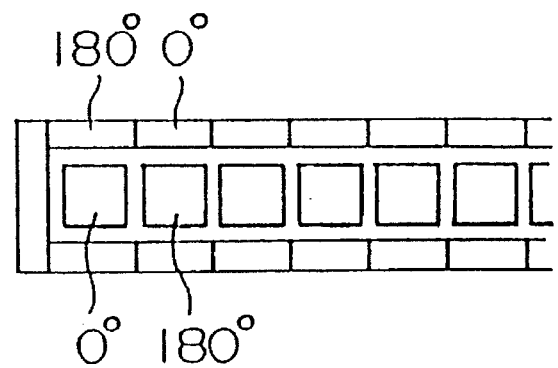
FIG. 21C is a partial plan view of another mask for the hole pattern according to the present invention.
Figure 22A:
FIG. 22A is a plan view showing the light intensity distribution for 0 μm defocus when the mask shown in FIG. 21A is used.
Figure 22B:
FIG. 22B is a plan view showing the light intensity distribution for 1 μm defocus when the mask shown in FIG. 21A is used.
Figure 22C:
FIG. 22C is a plan view showing the light intensity pattern for 0 μm defocus when the mask shown in FIG. 21B is used.
Figure 22D:
FIG. 22D is a diagram showing the light intensity distribution for 1 μm defocus when the mask shown in FIG. 21B is used.
Figure 22E:
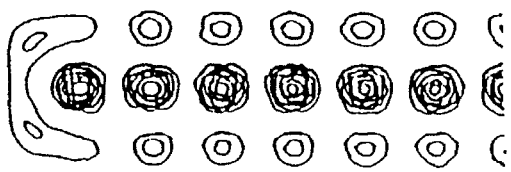
FIG. 22E is a plan view showing the light intensity distribution for 0 μm defocus when the mask shown in FIG. 21C is used.
Figure 22F:
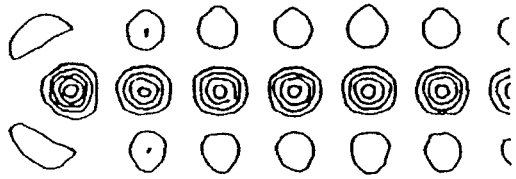
FIG. 22F is a plan view showing the light intensity distribution for 1 μm defocus when the mask shown in FIG. 21C is used.

The light intensity distributions obtained by the masks in FIGS. 21A, 21B and 21C are shown in FIGS. 22A, 22B and 22C, 22D. In spite of the improvement in the depth of focus by the mask subjected to collective conversion according to Equation (7), the light intensity is reduced at the end of the pattern. In the case of the mask shown in FIG. 21C, a uniform light intensity distribution having a narrow FWHM is realized without any reduction in light intensity at the pattern ends. The improved (modified) mask shown in FIG. 21C may be formed through exactly the same process as the conventional phase-shifting mask is formed.

In the case where holes are arranged at the period √2 times larger than the wiring pitch (quasi-folded bit line cell), a more desirable effect is obtained by not introducing any phase difference between adjacent patterns.

Eleventh embodiment

An example of application of the present invention to a mask having hole patterns of different feature sizes will be described.

Figure 23A:
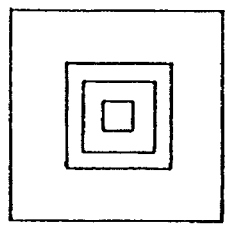
FIG. 23A is a diagram showing a mask for the hole pattern according to the present invention.
Figure 23D:
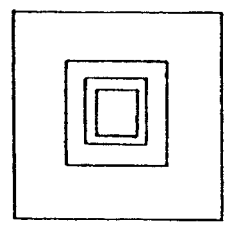
FIG. 23D is a diagram showing another mask for the hole pattern according to the present invention.
Figure 23G:
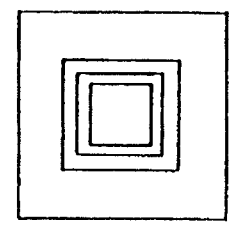
FIG. 23G is a diagram showing another mask for the hole pattern according to the present invention.
Figure 23B:
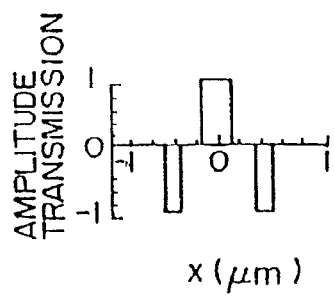
FIG. 23B is a diagram showing the amplitude transmittance of the mask.
Figure 23E:
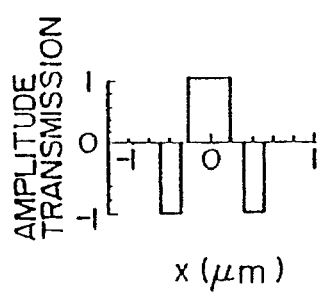
FIG. 23E is a diagram showing the amplitude transmittance of the same mask.
Figure 23H:
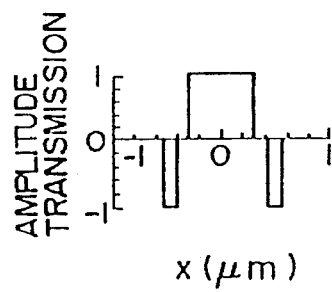
FIG. 23H is a diagram showing the amplitude transmittance of the same mask.
Figure 23C:
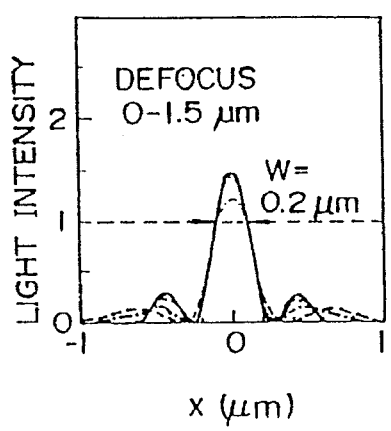
FIG. 23C is a diagram showing the light intensity obtained when the same mask is used.
Figure 23F:
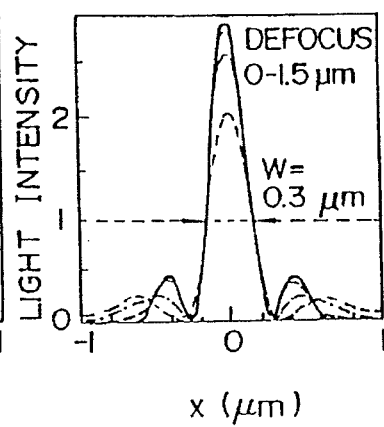
FIG. 23F is a diagram showing the light intensity obtained when the same mask is used.
Figure 23I:
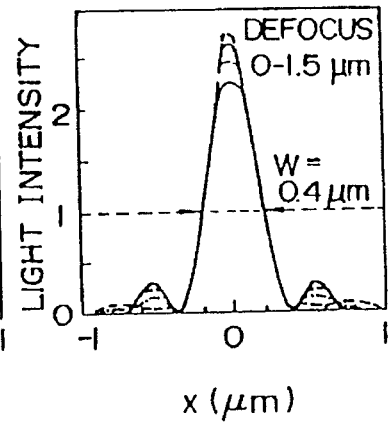
FIG. 23I is a diagram showing the light intensity obtained when the same mask is used.

A mask including three types of patterns subjected to discrete approximation as shown in FIGS. 23A, 23B; 23D, 23E; and 23G, 23H is prepared, and is used to effect exposure and development as in the eighth embodiment, thereby producing a resist pattern. The defocus dependence of the light intensity distribution obtained by exposure is shown in FIGS. 23C, 23F and 23I.

FIG. 23D represents a limit beyond which the FWHM of the light intensity distribution could not be reduced any more even by changing the arrangement. In FIG. 23A, the sizes (widths) of the main pattern and sub-pattern shown in FIG. 23D are reduced. As a result, the absolute value of light intensity distribution is reduced without changing the shape thereof. In FIG. 23G, on the other hand, the FWHM of light intensity distribution was expanded by changing the values of β and θ in Equation (7). By using the mask patterns shown in FIGS. 23A, 23D and 23G, hole patterns having diameters of about 0.2 μm, 0.3 μm and 0.4 μm were produced. These patterns correspond substantially to the width (W in the drawing) of the light intensity distribution at the level of light intensity 1 shown in the drawings.

In this embodiment, the same exposure wavelength, numerical aperture, coherence factor and the resist process were used as in the first embodiment. The present invention, however is not limited to them. There is more than one pattern arrangement for producing a resist pattern of the desired size, other than those shown in FIGS. 23A to 23I. Although the absolute value of light intensity was reduced by reducing the pattern width according to the present embodiment, the transmittance may alternatively be reduced.

It is possible according to the present invention to meet the mask requirements including various sizes of holes by pattern conversion or subsequent approximation in accordance with each hole pattern size.

As described above, according to the present invention, a mask is projected for exposure on a substrate through a projection lens by use of light to form a pattern on the substrate. In the process, the complex amplitude transmittance distribution of the mask pattern or the pupil of the projection lens (or the aperture stop at a position conjugate therewith) or the illumination distribution of an effective light source emitting the light are set in such a manner as to produce an image having amplitudes of a plurality of images formed at different points along the light axis, which amplitudes are superposed with an appropriate phase difference. In the case of shortening the wavelength and increasing the NA to improve the resolution limit, therefore, a large depth of focus and an excellent image quality can be realized at the same time.

Also, according to the present invention, an optical filter having a complex amplitude transmittance distribution expressed as $$T(r) = \cos(2\pi\beta r^2 - \theta/2), (\beta, \theta: \text{Appropriate constant})$$

is realized with the radial coordinate r standardized by the maximum radius as a function at the pupil or aperture stop position. By doing so, even in the case where the wavelength is shortened or NA is increased to improve the resolution limit, it is possible to maintain a large depth of focus and a high image quality.

Further, according to the present invention, a layout pattern plotted on the LSI is subjected to Fourier transformation, and the subsequent pattern data are multiplied by $\cos(2\pi\beta f^2 - \theta/2)$. The resulting pattern subjected to inverse Fourier transform or an approximate resolution thereof is used as a mask pattern, so that an LSI is fabricated by exposure, thereby making it possible to increase the light intensity as well as to secure a large depth of focus and a high quality image at the same time.

As a result, a fine pattern can be formed on the entire surface of an LSI substrate with an advanced three-dimensional device structure, thereby realizing a pattern of 0.2 to 0.3 μm in an optical exposure system.

We claim:

1. A method of manufacturing a semiconductor device having a principal surface to be processed, comprising the steps of:

preparing a mask having a predetermined pattern;

preparing a projection lens structure having a filter;

forming first and second projected images of said predetermined pattern at a first image plane and a second image plane, respectively;

setting said principal surface between said first and second image planes; and exposing said mask with light to project said predetermined pattern onto said principal surface through said projection lens structure.

2. A method of manufacturing a semiconductor device according to claim 1, wherein said light comprises an excimer laser beam.

3. A method of manufacturing a semiconductor device, comprising the steps of:

preparing a mask having a predetermined pattern;

preparing a projection lens structure having a filter for partially phase-shifting light passing therethrough and for increasing uniformity of light intensity distribution along a light axis in the vicinity of an image plane of said projection lens structure;

setting a principal surface of said semiconductor device in the vicinity of said image plane; and exposing said mask with light to project said predetermined pattern onto said principal surface through said projection lens structure.

4. A method of manufacturing a semiconductor device according to claim 3, wherein said light comprises an excimer laser beam.

5. A method of manufacturing a semiconductor device, comprising the steps of:

preparing a mask having a predetermined pattern;

preparing a projection lens structure having a filter with a first region and a second region for passing light therethrough with different respective phases;

setting a principle surface of the semiconductor device at the exposure field of said projection lens structure; and exposing said mask with light to project said predetermined pattern onto said principal surface through said projection lens structure.

6. A method of manufacturing a semiconductor device according to claim 5, wherein said light comprises an excimer laser beam.

7. A method of manufacturing a semiconductor device according to claim 5, wherein one of said first and second regions comprises a Cr pattern having a discrete thickness distribution.

8. A method of manufacturing a semiconductor device according to claim 5, wherein said filter comprises a substrate through which said light passes without shifting phase, and a phase-shifting film on said substrate which phase-shifts light passing through said phase-shifting film.

9. A method of manufacturing a semiconductor device according to claim 8, wherein said substrate comprises quartz and said film comprises one of Al, Cr, $MgF_2$, $SiO_2$, and layered $Al/SiO_2$.

10. A method of manufacturing a semiconductor device having first and second layers to be processed, comprising:

preparing a mask having a hole pattern for projection onto said first layer and a line-and-space pattern for projection onto said second layer;

preparing a projection lens structure;

preparing a first filter operably corresponding to said hole pattern and comprising a first region and a second region for passing light having different respective phases;

preparing a second filter operably corresponding to said line-and-space pattern and comprising a third region and a fourth region for passing light having different respective phases;

inserting one of said first and second filters into said lens structure in response to presence of one of said hole pattern and said line-and-space pattern being in a projection light path;

setting said semiconductor device at the exposure field of said projection lens structure; and exposing said mask with projection light to project one of said hole pattern and said line-and-space pattern onto a respective one of said first and second layers of said device through said projection lens structure.

11. A method of manufacturing a semiconductor device according to claim 10, further comprising the step of preparing a third, non-phase-shifting filter, said third filter being inserted into said projection lens structure in the absence of said first and second filters.

12. A method of manufacturing a semiconductor device according to claim 1, wherein said third filter comprises an optical parallel plate having the same material and thickness as those of said first and second filters.

* * * * *